(12) United States Patent
Tachibana et al.

(10) Patent No.: US 8,895,456 B2
(45) Date of Patent: Nov. 25, 2014

(54) METHOD OF DEPOSITING A FILM

(71) Applicant: Tokyo Electron Limited, Tokyo (JP)

(72) Inventors: Mitsuhiro Tachibana, Iwate (JP);
Hiroaki Ikegawa, Yamanashi (JP); Yu Wamura, Iwate (JP); Muneyuki Otani, Iwate (JP); Jun Ogawa, Yamanashi (JP); Kosuke Takahashi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/132,050

(22) Filed: Dec. 18, 2013

(65) Prior Publication Data
US 2014/0179122 A1  Jun. 26, 2014

(30) Foreign Application Priority Data

Dec. 21, 2012 (JP) ................. 2012-279922

(51) Int. Cl.
*H01L 21/31* (2006.01)
*H01L 21/469* (2006.01)
*H01L 21/02* (2006.01)
*H01L 21/687* (2006.01)
*C23C 16/30* (2006.01)
*C23C 16/40* (2006.01)
*C23C 16/455* (2006.01)

(52) U.S. Cl.
CPC ...... *H01L 21/0228* (2013.01); *H01L 21/68764* (2013.01); *H01L 21/02148* (2013.01); *H01L 21/02164* (2013.01); *H01L 21/02181* (2013.01); *H01L 21/022* (2013.01); *H01L 21/68771* (2013.01); *C23C 16/308* (2013.01); *C23C 16/401* (2013.01); *C23C 16/405* (2013.01); *C23C 16/45529* (2013.01); *C23C 16/45531* (2013.01); *C23C 16/45551* (2013.01)

USPC ........... 438/783; 118/712; 118/719; 118/728; 118/730; 257/E21.211; 257/E21.278; 427/568; 427/579; 427/595; 438/680; 438/685; 438/778; 438/784; 438/786; 438/787

(58) Field of Classification Search
USPC .......... 118/712, 719, 728, 730; 257/E21.211, 257/E21.278; 427/568, 579, 595; 438/680, 438/685, 778, 783, 784, 786, 787
See application file for complete search history.

(56) References Cited

U.S. PATENT DOCUMENTS

2011/0159702 A1 *  6/2011  Ohizumi et al. .............. 438/778

FOREIGN PATENT DOCUMENTS

JP           4661990           3/2011

* cited by examiner

*Primary Examiner* — Asok K Sarkar
(74) *Attorney, Agent, or Firm* — IPUSA, PLLC

(57) ABSTRACT

A method of depositing a film of forming a doped oxide film including a first oxide film containing a first element and doped with a second element on substrates mounted on a turntable including depositing the first oxide film onto the substrates by rotating the turntable predetermined turns while a first reaction gas containing the first element is supplied from a first gas supplying portion, an oxidation gas is supplied from a second gas supplying portion, and a separation gas is supplied from a separation gas supplying portion, and doping the first oxide film with the second element by rotating the turntable predetermined turns while a second reaction gas containing the second element is supplied from one of the first and second gas supplying portions, an inert gas is supplied from another one, and the separation gas is supplied from the separation gas supplying portion.

20 Claims, 16 Drawing Sheets

Every treatment

Base HfO

Base HfSiO

Every treatment

Post treatment

METHOD OF DEPOSITING A FILM

CROSS-REFERENCE TO RELATED APPLICATIONS

This patent application is based upon and claims the benefit of priority of Japanese Patent Application No. 2012-279922 filed on Dec. 21, 2012, the entire contents of which are incorporated herein by reference.

BACKGROUND OF THE INVENTION

1. Field of the Invention

The present invention relates to a method of depositing a film. Specifically, the present invention relates to method of depositing an oxide film doped with a predetermined element.

2. Description of the Related Art

A manufacturing process of a semiconductor integrated circuit (IC) includes a process of depositing a thin film on a semiconductor wafer.
In this process, improvement in evenness of a surface of a wafer is required in view of further microminiaturization of an IC. As a method of depositing a film to satisfy this requirement, a method of depositing the film called an atomic layer deposition (ALD) method or a molecular layer deposition (MLD) method is considered. According to the ALD method, a cycle, in which one (a reaction gas A) of reaction gases which mutually react is caused to, adsorb on the surface of the wafer, and the adsorbing reaction gas A is reacted with the other one (a reaction gas B) of the reaction gases, is repeated to thereby deposit a thin film made of a reaction product on the surface of the wafer. Because the ALD method uses the adsorption of the reaction gas onto the surface of the wafer, the ALD method has an advantage that film thickness evenness and film thickness controllability are excellent.

A turntable-type film deposition apparatus is disclosed in Japanese Patent No. 4661990 as a film deposition apparatus performing the ALD method. This film deposition apparatus includes a turntable, which is rotatable and is positioned in a vacuum chamber, and on which a plurality of wafers are mounted, a separating area that is laid out above the turntable and separates a gas supplying area for the reaction gas A from a gas supplying area for the reaction gas B, evacuation ports corresponding to the gas supplying areas where the reaction gas A and the reaction gas B are supplied, and an evacuation device connected to these evacuation ports. In this film deposition apparatus, the wafers pass through the gas supplying area for the reaction gas A, the separating area, the gas supplying area for the reaction gas B, and the separating area along rotation of the turntable. With this, the reaction gas A adsorbs onto the surface of the wafer in the gas supplying area for the reaction gas A, and the reaction gas A reacts with the reaction gas B in the gas supplying area for the reaction gas B. Therefore, it is not necessary to change the reaction gas A to the reaction gas B while depositing the film, and the reaction gases A and B can be continuously supplied. Therefore, there is an advantage that an evacuation/purge process is unnecessary thereby shorting a time period for depositing the film.

In a case where an oxide film containing a predetermined element is deposited using the above turn-table type film deposition apparatus, by using the reaction gas A being a reaction gas containing the above predetermined element such as a silicon gas containing silicon and the reaction gas B being an oxide gas such as ozone, an oxide film containing a predetermined element can be formed. In this case, a gas containing the predetermined element adsorbs firstly onto the surface of the wafer, an oxidation gas (the reaction gas B) is supplied onto the surface of the wafer, and the reaction gas A and the reaction gas B react thereby depositing a molecular layer containing the predetermined element. As described, the reaction gas containing the predetermined element adsorbs firstly onto the surface of the wafer and reacts with the oxidation gas on the surface of the wafer. Thus, the oxide film containing the predetermined element is deposited on the surface of the wafer.

According to the method of depositing the film, in a case where oxide films containing different types of elements are deposited and laminated to form a laminate structure, the above film deposition processes of depositing the oxide films are repeated. For example, this method of depositing the film enables film deposition of an oxide film having a laminate structure of ZrAlO, HfAlO, and HfSiO to be substantialized. Application to a High-k film is also considered.

In recent years, an oxide film containing two metal elements doped with nitrogen is required for forming a High-k film, which is used for a gate oxide film or the like. For example, establishment of a method of depositing a film such as HfSiON or HfAlON is required.

As described above, the turntable-type film deposition apparatus has an advantage that a time period for depositing the film can be shortened. A process of depositing HfSiON or HfAlON doped with nitrogen on a composite oxide film using this turntable-type film deposition apparatus to efficiently obtain a high quality film is desired. Further, various applications of the film deposition of the oxide film doped with nitrogen is possible. There may be cases where a single film is doped with an element other than nitrogen such as silicon.

SUMMARY OF THE INVENTION

Accordingly, embodiments of the present invention may provide a novel and useful method of depositing a film.

According to an aspect of the present invention, there is provided a method of depositing a film of forming a doped oxide film, which includes a first oxide film containing a first element and doped with a second element, on a plurality of substrates using a film deposition apparatus including a turntable that is accommodated in a chamber, is rotatable, and includes mounting portions formed on an upper surface of the turntable so that the substrates are mounted on the mounting portions, a first process area laid out above the upper surface of the turntable and being provided with a first reaction gas supplying portion, which supplies gases toward the upper surface of the turntable, a second process area arranged apart from the first process area along a peripheral direction of the turntable and being provided with a second reaction gas supplying portion, which supplies the gases toward the upper surface of the turntable, and a separation area including a separation gas supplying portion provided between the first process area and the second process area and supplying a separation gas onto the upper surface of the turntable, and a ceiling surface forming a narrow space so that the narrow space for introducing the separation gas supplied from the separation gas supplying portion to the first process area and the second process area is formed between the ceiling surface and the surface of the turntable, the method of depositing the film including a first film deposition process of depositing the first oxide film containing the first element onto the substrates by rotating the turntable a predetermined number of turns while a first reaction gas containing the first element is supplied from the first reaction gas supplying portion, an oxidation gas is supplied from the second reaction gas supplying portion, and the separation gas is supplied from the separation gas supplying portion; and a doping process of doping the first oxide film with the second element by rotating the turntable a predetermined number of turns while a second reaction gas containing the second element is supplied from one of the first reaction gas supplying portion and the second reaction gas supplying portion, an inert gas is supplied from another one of the first reaction gas supplying portion and the second reaction gas supplying portion, and the separation gas is supplied from the separation gas supplying portion.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF EMBODIMENTS

A description is given below, with reference to the figures of the embodiments of the present invention.

In the embodiments described below, the reference symbols typically designate as follows:
1: chamber;
2: turntable;
4: convex portion;
11: ceiling plate;
12: chamber body;
15: transfer opening;
24: circular concave portion (wafer mounting portion);
31,32: reaction gas nozzle;
41, 42: separation gas nozzle;
D: separating area;
P1: first process area;
P2: second process area;
H: separation space; and
W: wafer.

In the above-mentioned figures, the same or corresponding reference symbols are attached to the same or corresponding members and parts, and description of overlapping explanation is omitted. Further, in the figures, relative ratios among the members and the parts are not intended to be illustrated. Therefore, dimensions are to be practically determined by a person ordinarily skilled in art in light of the following non-limiting embodiment.

First Embodiment (Film Deposition Apparatus)

Figure 1:
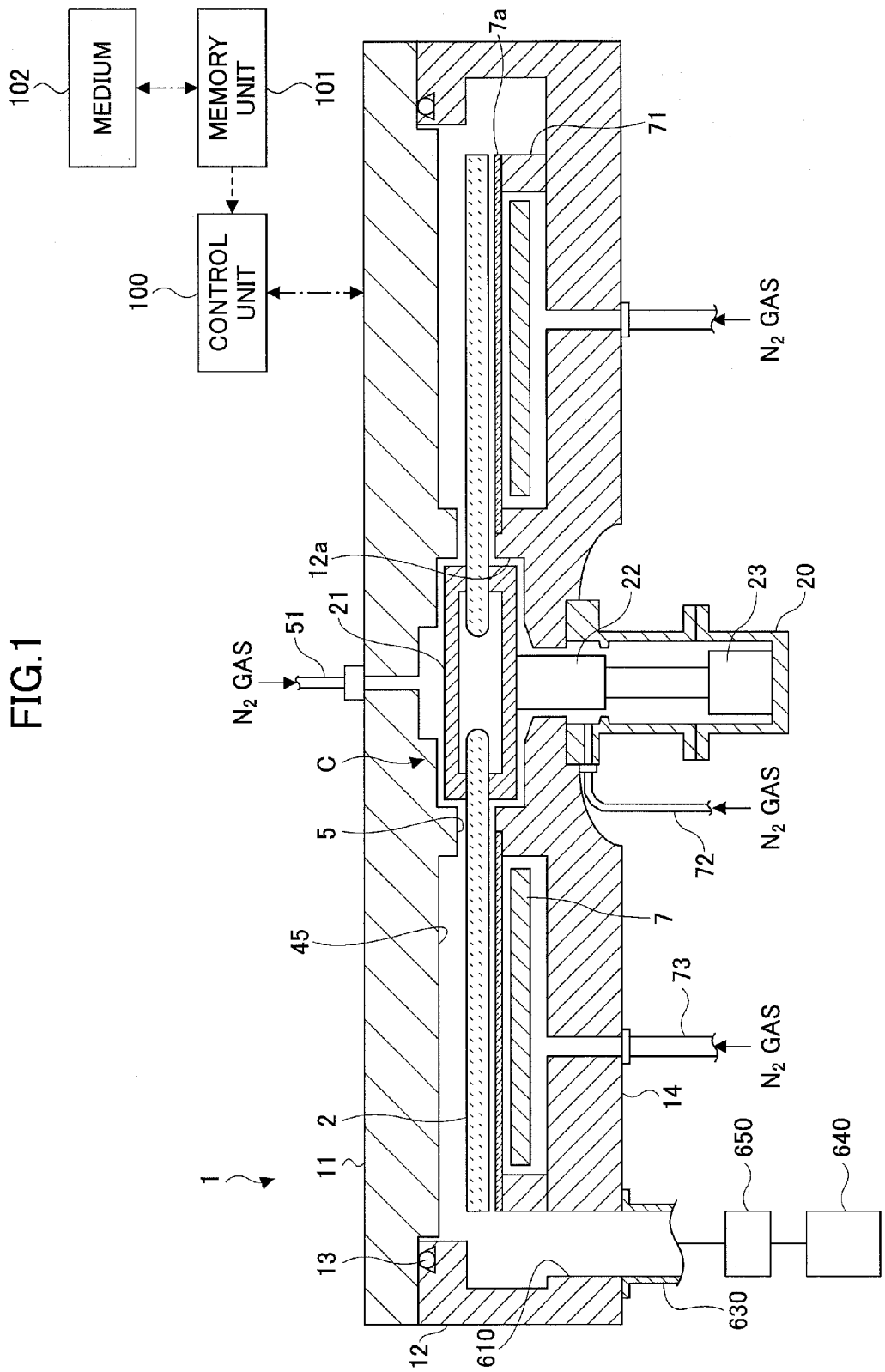
FIG. 1 is a cross-sectional view for illustrating a film deposition apparatus preferable for performing a method of depositing a film of an embodiment of the present invention.
Figure 2:
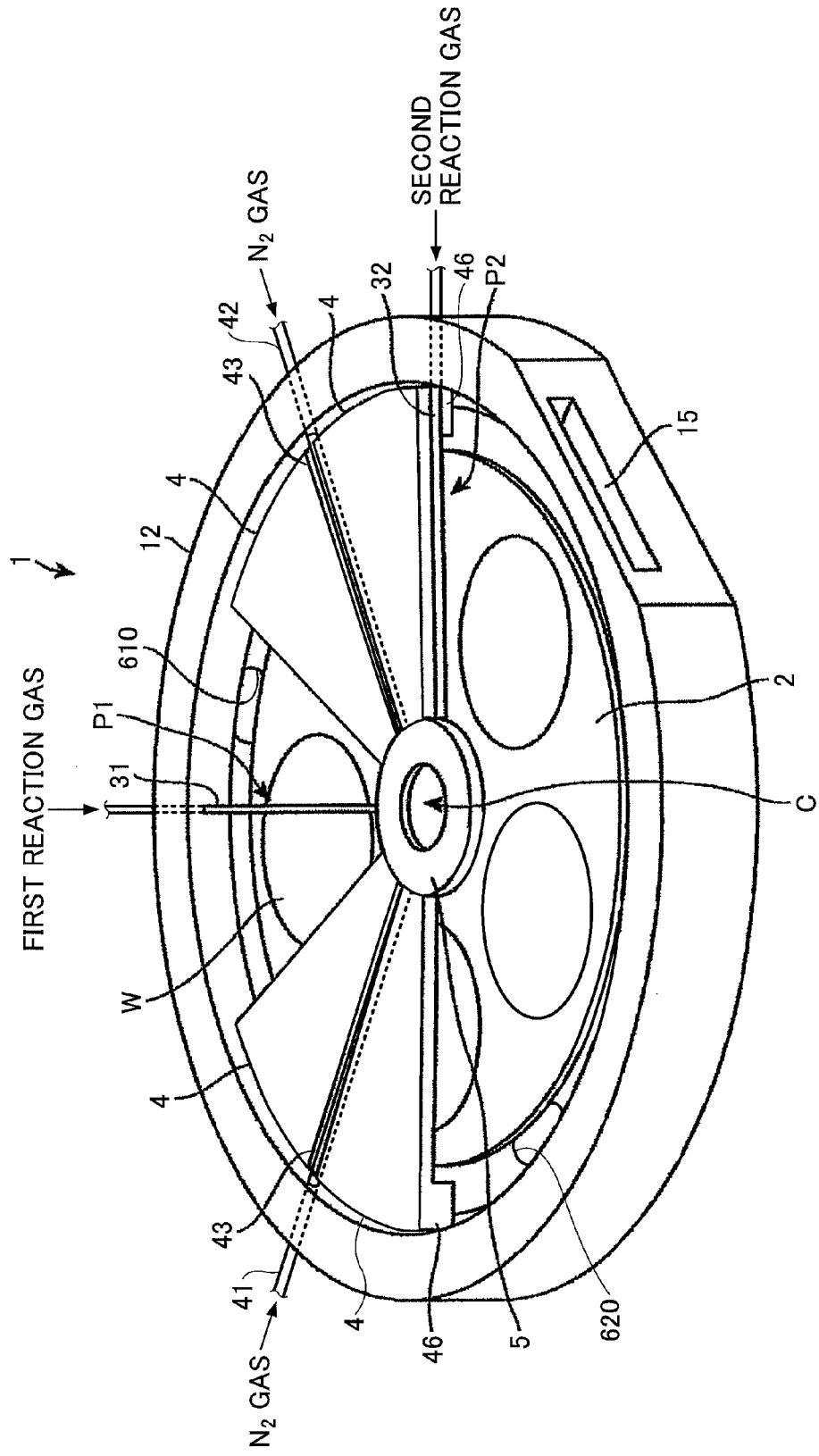
FIG. 2 is a perspective view for illustrating a structure inside a vacuum chamber of the film deposition apparatus illustrated in FIG. 1.
Figure 3:
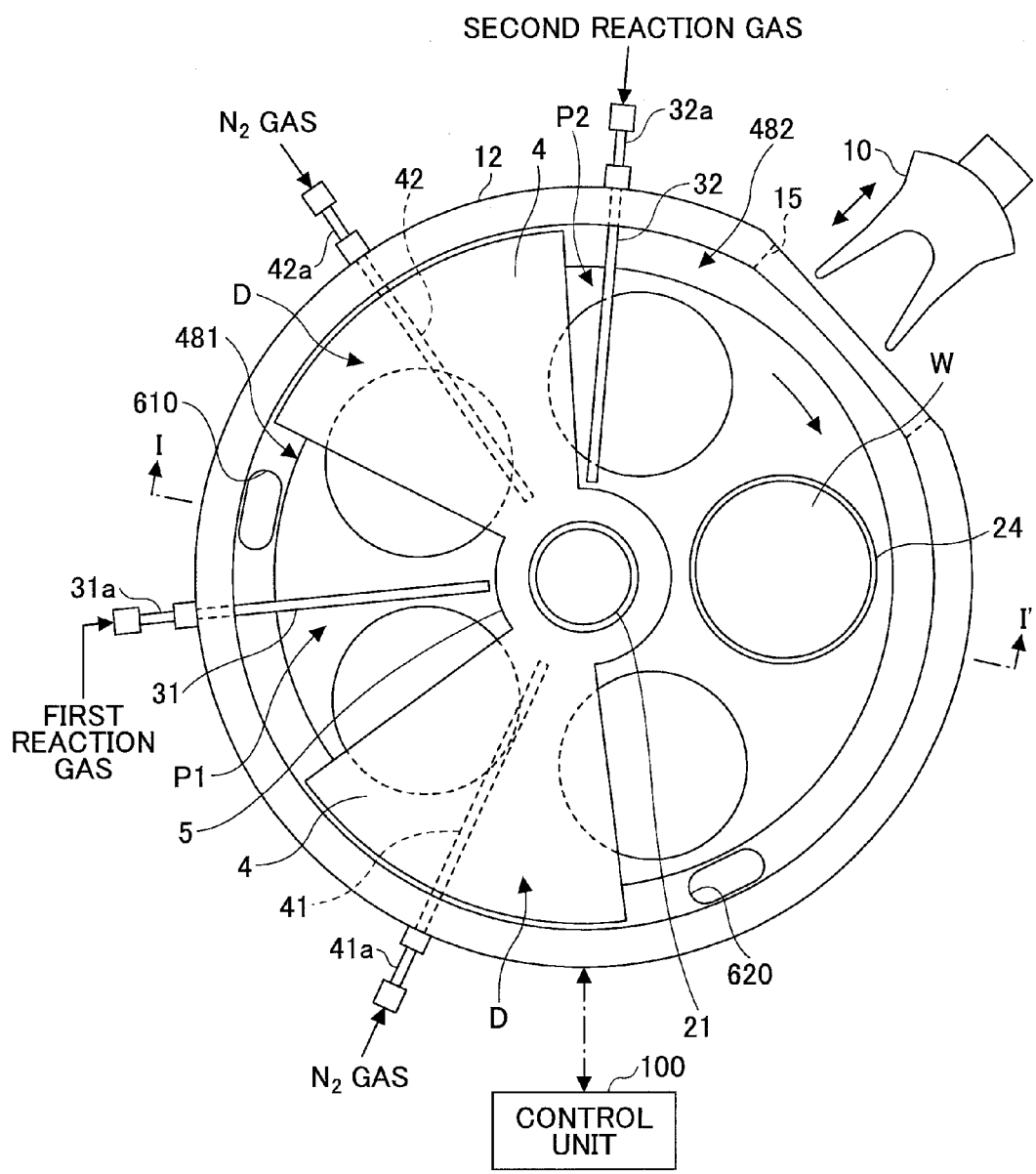
FIG. 3 is a schematic plan view of illustrating a structure inside the vacuum chamber of the film deposition apparatus illustrated in FIG. 1.

At first, referring to FIGS. 1 to 3, a film deposition apparatus suitable for performing a method of depositing a film of a first embodiment is described.

FIG. 1 is a cross-sectional view for illustrating a film deposition apparatus preferable for performing a method of depositing a film of the first embodiment of the present invention. FIG. 2 is a perspective view for illustrating a structure inside a vacuum chamber of the film deposition apparatus illustrated in FIG. 1. FIG. 3 is a schematic plan view for illustrating a structure inside the vacuum chamber of the film deposition apparatus illustrated in FIG. 1.

Referring to FIGS. 1 to 3, the film deposition apparatus of the first embodiment includes a chamber 1 having a substantially circular shape in its plan view and a flattened shape in its side view, and a turntable 2 having the rotational center in the center of the chamber 1. The chamber 1 includes a chamber body 12 having a bottomed cylindrical shape, and a ceiling plate 11, which is detachably provided onto the upper surface of the chamber body 12 through a sealing member 13 (see FIG. 1) such as an O-ring to hermetically seal the chamber 1.

The turntable 2 is fixed by a core portion 21 in a cylindrical shape at the center portion of the turntable 2. The core unit 21 is fixed to the upper end of a rotational shaft 22 extending in the vertical direction. The rotational shaft 22 penetrates a bottom portion 14 of the chamber 1. The lower end of the rotational shaft 22 is attached to a driving mechanism 23, which causes the rotational shaft 22 (see FIG. 1) to rotate around the vertical axis of the rotational shaft 22. The rotational shaft 22 and the driving mechanism 23 are accommodated in a cylindrical case body 20 whose upper surface is opened. A flange on the upper surface of the case body 20 is hermetically attached to the lower surface of a bottom portion 14 of the chamber 1 to isolate the inner atmosphere from the outer atmosphere of the case body 20 and to maintain a gastight state between the inner atmosphere and the outer atmosphere of the case body 20.

An evacuation port 610 communicates with an evacuation pipe 630 provided in an outer edge portion inside the chamber 1. The evacuation pipe 630 is connected to a vacuum pump 640 through a pressure adjuster 650 so that a gas is evacuated from the inside of the chamber 1 through the evacuation port 610.

Referring to FIG. 2 and FIG. 3, circular concave portions 24 for receiving a plurality of semiconductor wafers (5 wafers are illustrated in FIGS. 2 and 3) are provided on a surface of the turntable 2 along a rotational direction (a peripheral direction) of the turntable 2. FIG. 3 illustrates a state where the wafer W is mounted in only one circular concave portion 24 for convenience. The inner diameter of the circular concave portion 24 is slightly greater than the diameter (for example, 300 mm) of the wafer W by, for example, 2 mm. The depth of the circular concave portion 24 is substantially equal to the thickness of the wafer W. Therefore, when the wafer W is accommodated in the circular concave portion 24, the height of the surface of the wafer W becomes substantially the same as the height of the surface of the turntable 2 in an area where the wafer W is not mounted.

FIGS. 2 and 3 illustrate the structure inside the chamber 1. For convenience, the ceiling plate 11 is omitted in FIGS. 2 and 3. Referring to FIGS. 2 and 3, a reaction gas nozzle 31, a reaction gas nozzle 32, and separation gas nozzles 41 and 42, each made of, for example, quartz, are arranged above the turntable 2. In FIGS. 2 and 3, the separation gas nozzle 41, the reaction gas nozzle 31, the separation gas nozzle 42, and the reaction gas nozzle 32 are sequentially arranged in a clockwise direction (the rotational direction of the turntable 2) from the transfer opening 15 (described below) at intervals in the peripheral direction of the chamber 1. These nozzles 31, 32, 41, and 42 are attached to the chamber body 12 by fixing gas introducing ports 31a, 32a, 41a, and 42a (see FIG. 3), which are base portions of the nozzles 31, 32, 41, and 42, respectively, to the outer peripheral wall of the chamber 1 so as to extend along radii of the chamber body 12 in parallel to the turntable 2.

A first reaction gas supplying source storing the first reaction gas is connected to the reaction gas nozzle 31 through an on-off valve and a flow rate adjuster (not illustrated). A second reaction gas supplying source storing the second reaction gas is connected to the reaction gas nozzle 32 through an on-off valve and a flow rate adjuster (not illustrated).

The first reaction gas is preferably a gas, which contains a metal element or a semiconductor element, and is selected so as to be used as an oxide film or a nitride film when the gas is changed to oxide or nitride. The second reaction gas is selected as an oxidation gas or a nitriding gas, with which a metal element or a semiconductor element reacts to produce metal oxide, metal nitride, semiconductor oxide, or semiconductor nitride. Specifically, the first reaction gas is preferably an organometallic gas (or a semiconductor gas) containing a metal element (or a semiconductor element). Further, the first reaction gas is preferably a gas having adsorptive property for a surface of the wafer W. The second reaction gas is preferably an oxidation gas or a nitriding gas, which can react with the first reaction gas adsorbed on the surface of the wafer 100 and whose reaction compound can be deposited on the surface of the wafer W.

Specifically, the first reaction gas is, for example, a reaction gas containing a hafnium element such as tetrakis (dimethylamino) hafnium (hereinafter, referred to as "TDMAH") provided to form hafnium oxide (generally referred to as "HfO" and may contain $HfO_2$) as the oxide film, a reaction gas containing a titanium element as the oxide film, or $TiCl_4$ or the like for forming TiN as the nitride film. The second reaction gas may be, for example, an ozone ($O_3$) gas as the oxidation gas or an ammonia ($NH_3$) gas as the nitriding gas.

A gas supplying source for supplying an inert gas such as a rare gas like Ar or He or a nitrogen ($N_2$) gas is connected to the separation gas nozzles 41 and 42 through an on-off valve (not illustrated) or a flow rate adjuster (not illustrated). A $N_2$ gas is used as the inert gas in the embodiment.

Figure 4:
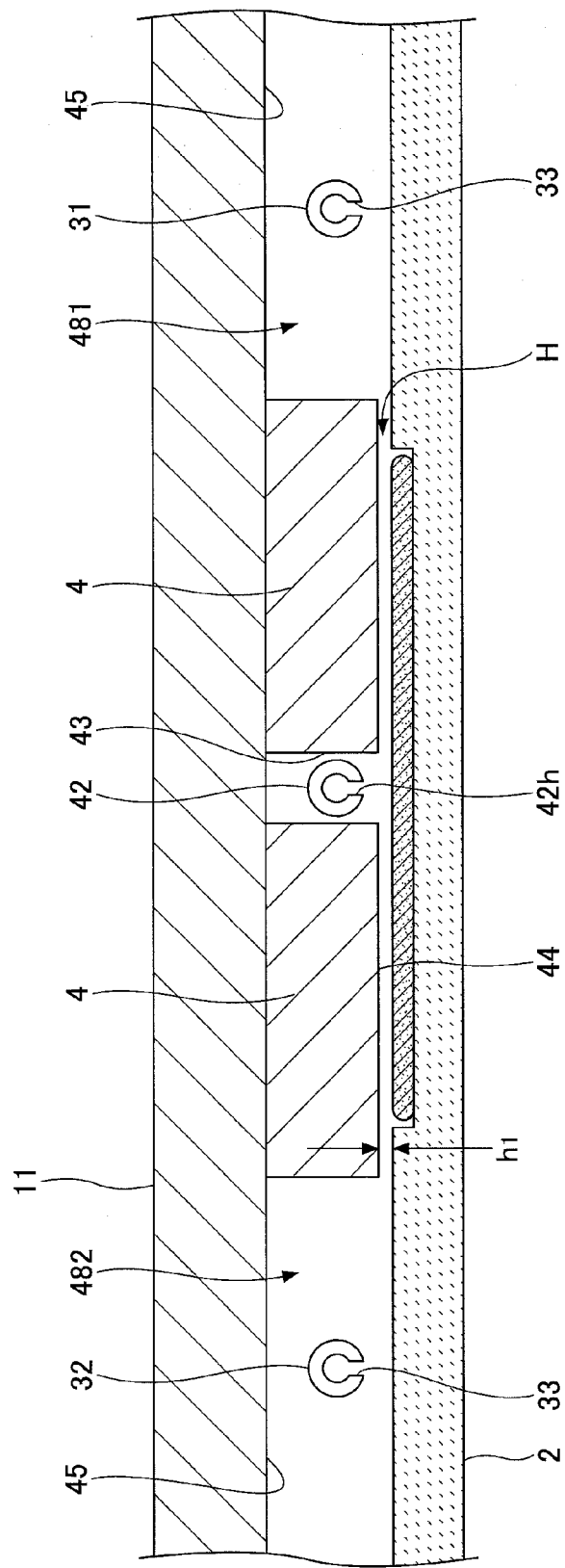
FIG. 4 is a cross-sectional view of the film deposition apparatus, which includes a reaction gas nozzle and a separation gas nozzle and is illustrated in FIG. 1.

FIG. 4 is a cross-sectional view of a part of the film deposition apparatus, which includes the reaction gas nozzles 31 and 32 and the separation gas nozzle 42 and is illustrated in FIG. 1. As illustrated in FIG. 4, a plurality of gas ejection holes 33 opening downward toward the turntable 2 are arranged in the reaction gas nozzles 31 and 32 along the longitudinal direction of the reaction gas nozzles 31 and 32 at intervals of, for example, 10 mm. As illustrated in FIG. 3, a lower area of the reaction gas nozzle 31 is a first process area P1 for causing the first reaction gas to adsorb onto the wafer W. The lower area of the reaction gas nozzle 32 becomes a second process area P2 where the first reaction gas adsorbing onto the wafer W in the first process area P1 is oxidized or nitrided. Lower areas of the separation gas nozzles 41 and 42 are separating areas D for separating the first process area P1 from the second process area P2 to prevent the first reaction gas and the second reaction gas from mixing.

Referring to FIGS. 2 and 3, two convex portions 4 are provided inside the chamber 1. The convex portion 4 has a substantially sector form in its plan view with its apex cut in a circular arc shape. Within this embodiment, an inner circular arc is connected to a ring-shaped protruding portion (described later), and an outer circular arc is arranged along an inner peripheral surface of the chamber body 12 of the chamber 1.

FIG. 4 is a cross-sectional view of the chamber 1 along a concentric circle of the turntable 2 from the reaction gas nozzle 31 to the reaction gas nozzle 32. As illustrated in FIG. 4, the convex portion 4 is attached to the back surface of the ceiling plate 11. Therefore, a flat and low ceiling surface 44 (a first ceiling surface) being a lower surface of the convex portion 4 and a high ceiling surface 45 (a second ceiling surface), which is positioned on both sides of the ceiling surface 44 and higher than the ceiling surface 44 exist inside the chamber 1.

Further, as illustrated in FIG. 4, a groove 43 is formed in the center in the peripheral direction of the convex portion 4 and extends along a radius direction of the turntable 2. The separation gas nozzle 42 is accommodated in the groove 43. Another groove portion 43 is similarly formed in another convex portion 4. The separation gas nozzle 41 is accommodated in the other groove portion 43. Referring to FIG. 4, a gas ejection hole 42h formed in the separation gas nozzle 42 is illustrated. A plurality of gas ejection holes 42h are formed along the longitudinal direction of the separation gas nozzle 42 at predetermined intervals (for example, 10 mm). An opening diameter of the gas ejection hole is, for example, 0.3 mm to 1.0 mm. Although it is omitted from the illustration, gas ejection holes are formed in the separation gas nozzle 41 in a manner similar thereto.

The reaction gas nozzles 31 and 32 are provided in spaces lower than the high ceiling surface 45. The reaction gas nozzles 31 and 32 are provided in the vicinity of the wafer W and apart from the ceiling surface 45. For convenience of explanation, the lower space of the ceiling surface 45 where the reaction gas nozzle 31 is provided is called a space 481, and the lower space of the ceiling surface 45 where the reaction gas nozzle 32 is provided is called a space 482.

A separation space H, which is narrow, is formed between the low ceiling surface 44 and the turntable 2. When the $N_2$ gas is supplied from the separation gas nozzle 42, the $N_2$ gas flows toward the spaces 481 and 482 through the separation space H. At this time, the volume of the separation space H is smaller than the volumes of the spaces 481 and 482. Therefore, the pressure of the separation space H can be set relatively higher than the pressures in the spaces 481 and 482 by the $N_2$ gas. Said differently, the separation space H provides a pressure barrier between the spaces 481 and 482. Further, the $N_2$ gas flowing from the separation space H to the spaces 481 and 482 works as counter flows against the first reaction gas from the first process area P1 and the second reaction gas (the oxidation gas or the nitriding gas) from the second process area P2. Therefore, the first reaction gas from the first process area P1 and the second reaction gas from the second process area P2 are separated by the separation space H. Therefore, it is possible to prevent mixture and reaction of the first reaction gas and the oxidation gas or the nitriding gas in the chamber 1.

It is preferable to set the height hl of the ceiling surface 44 relative to the upper surface of the turntable 2 suitable for increasing the pressure in the separation space H higher than the pressures in the spaces 481 and 482 in consideration of the pressure inside the chamber 1 at the time of depositing the film, the rotational speed of the turntable 2, the supply amount of the separation gas (the $N_2$ gas), or the like.

As illustrated in FIGS. 1 to 3, the ring-shaped protruding portion 5 surrounding the outer periphery of the core portion 21, to which the turntable 2 is fixed, is provided under the lower surface of the ceiling plate 11. The ring-shaped protruding portion 5 is continuously formed from the convex portions 4 at portions on a side of the rotation center of the convex portions 4. The lower surface of the ring-shaped protruding portion 5 has substantially the same height as that of the ceiling surface 44.

FIG. 1 is a cross-sectional view taken along a line I-I' of FIG. 3. FIG. 1 illustrates an area where the ceiling surface 45 is provided.

Figure 5:
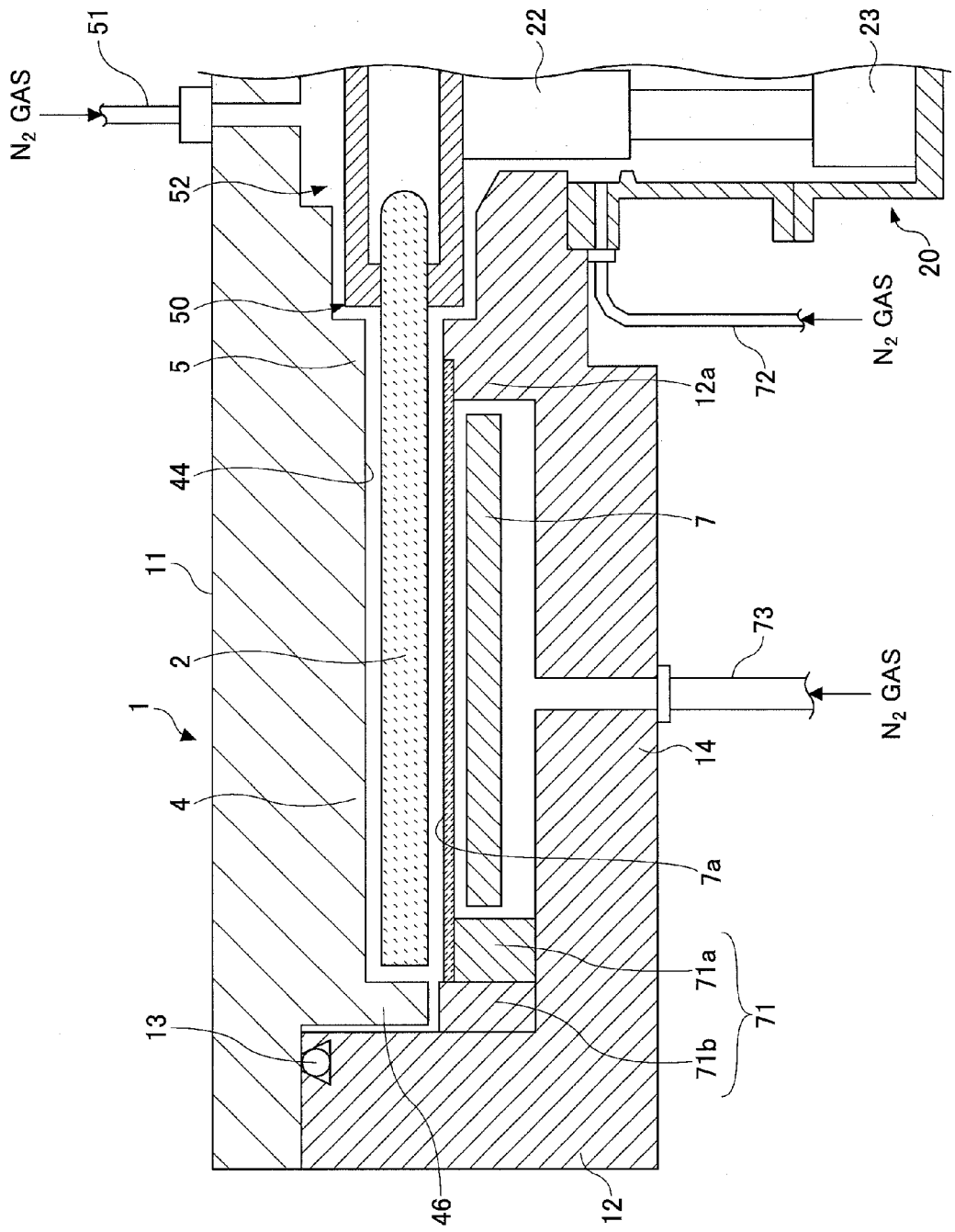
FIG. 5 is a cross-sectional view of another part of the film deposition apparatus, which includes a ceiling surface and is illustrated in FIG. 1.

FIG. 5 is a cross-sectional view of an area including the ceiling surface 44 of the film deposition apparatus 1. As illustrated in FIG. 5, a peripheral edge portion (a portion of the chamber 1 on the outer edge side) of the convex portion 4 in a substantially sector form has a bent portion 46 bent in a L-like shape so as to face the outer end surface of the turntable 2. The bent portion 46 prevents communication of the gas between the space 481 and the space 482 through a space between the turntable 2 and the inner peripheral surface of the chamber body 12. The convex portion 4 in the substantially sector form is provided in the ceiling plate 11. Because the ceiling plate 4 is detachable from the chamber body 12, there is a small gap between the outer peripheral surface of the bent portion 46 and the chamber body 12. A gap between the inner peripheral surface of the bent portion 46 and the outer edge surface of the turntable 2 and a gap between the outer peripheral surface of the bent portion 46 and the chamber body 12 are set to have a dimension similar to, for example, that of a gap between the ceiling surface 44 and the upper surface of the turntable 2.

Referring again to FIG. 3, the first evacuation port 610 communicating with the space 481 and a second evacuation port 620 communicating with the space 482 are formed between the turntable 2 and the inner peripheral surface of the chamber body. Referring to FIG. 1, the first and second evacuation ports 610 and 620 are connected to, for example, the vacuum pump 640 being an evacuating means through exhaust pipes 630.

As illustrated in FIGS. 1 and 5, a heater unit 7 being a heating means is provided in a space between the turntable 2 and the bottom portion 14 of the chamber 1. The wafer W on the turntable 2 is heated through the turntable 2 to have a temperature determined in a process recipe (for example, 450° C.). A ring-like cover member 71 is provided on the lower side of the periphery of the turntable 2 to prevent the gas from intruding into the space below the turntable 2. Referring to FIG. 5, the cover member 71 includes an inner member 71a provided in a position vertically corresponding to the outer edge portion of the turntable 2 and to an outer peripheral side outer than the outer edge portion of the turntable 2, and an outer member 71b provided between the inner member 71a and the inner wall surface of the chamber 1. The outer member 71b is provided in the vicinity of the bent portion 46 formed on the outer edge portion of the convex portion 4 under the bent portion 46. The inner member 71a surrounds the entire periphery of the heater unit 7 and is positioned under the outer edge portion and a portion slightly outer than the outer edge portion of the turntable 2.

A part of the bottom portion 14 closer to the rotation center than the space where the heater unit 7 is arranged has a ring-shaped protruding portion 12a protruding upward so as to approach the core portion 21, which is provided in the vicinity of the center portion of the lower surface of the turntable 2. A narrow space is formed between the ring-shaped protruding portion 12a and the core portion 21. Further, there is a narrow gap between the inner peripheral surface of the through hole for the rotational shaft 22 penetrating through the bottom portion 14 and the rotational shaft 22. The narrow space communicates with the case body 20. A purge gas supplying pipe 72 is provided in the case body 20 so that the $N_2$ gas being the purge gas is supplied into the narrow space to purge the narrow space. In the bottom portion 14 of the chamber 1, a plurality of purge gas supplying pipes 73 are provided to purge a space where the heater unit 7 is arranged under the heater unit 7 at intervals of a predetermined angle in the peripheral direction (only one purge gas supplying pipe 73 is illustrated in FIG. 5). Further, a lid member 7a is provided between the heater unit 7 and the turntable 2. The lid member 7a restricts the gas from intruding into an area where the heater unit 7 is installed by covering an area between the inner peripheral wall of the outer member 71b (the upper surface of the inner member 71a) and the upper end portion of the ring-shaped protruding portion 12a along the peripheral direction. The lid member 7a is made of, for example, quartz.

When the $N_2$ gas is supplied from the purge gas supplying pipe 72, the $N_2$ gas flows through a gap between the inner peripheral surface of the through hole for the rotational shaft 22 and the rotational shaft 22, a gap between the ring-shaped protruding portion 12a and the core portion 21, and a space between the turntable 2 and the lid member 7a, and is evacuated from the first evacuation port 610 or the second evacuation port 620 (FIG. 3). Further, when the $N_2$ gas is supplied from the purge gas supplying pipe 73, the $N_2$ gas flows from the space where the heater unit 7 is accommodated out of the a gap (not illustrated) between the lid member 7a and the inner member 71a, and is evacuated from the first evacuation port 610 or the second evacuation port 620 (FIG. 3). By these flows of the $N_2$ gas, it is possible to prevent the gases inside the spaces 481 and 482 from mixing by the gases passing through a space at a center lower space of the chamber 1 and a lower space of the turntable 2.

A separation gas supplying tube 51 is connected to a center portion of the ceiling plate 11 of the chamber 1. The separation gas being the $N_2$ gas is supplied to a space 52 between the ceiling plate 11 and the core portion 21. The separation gas supplied to the space 52 is discharged toward the periphery of the turntable 2 along the surface on the side of a wafer mounting area of the turntable 2 through a narrow gap 50 between the ring-shaped protruding portion 5 and the turntable 2. The space 50 is maintained to have a pressure higher than those of the spaces 481 and 482 by the separation gas. Therefore, it is possible to prevent the first reaction gas supplied to the first process area P1 and the second reaction gas supplied to the second process area P2 from mixing after passing through the center area C. Said differently, the space 50 (or the center area C) functions in a manner similar to the separation space H (or the separating area D).

As illustrated in FIGS. 2 and 3, a transfer opening 15 is formed in the side wall of the chamber 1 for serving and receiving the wafer W being the substrate between a transfer arm 10 provided outside the chamber 1 and the turntable 2. The transfer opening 15 is opened and closed by a gate valve (not illustrated). Further, lift pins (not illustrated) for lifting the wafers from their back surfaces and a lifting mechanism (not illustrated) are provided in the circular concave portions 24 being the wafer mounting area of the turntable 2. The wafers W are served and received at a position corresponding to the transfer opening 15. Therefore, the lift pins penetrate the circular concave portions 24 from a lower surface of the turntable 2 to bring the wafers W to the position where the wafers W are served and received with the transfer arm 10.

Further, as illustrated in FIG. 1, the film deposition apparatus of the first embodiment includes a control unit 100 including a computer for controlling operations of the entire film deposition apparatus. A memory of the control unit 100 stores a program causing the film deposition apparatus to perform a method of depositing a film described below under a control of the control unit 100. This program includes groups of steps for performing the method of depositing the film as described below and is stored in a medium 102 such as a hard disk, a compact disk, a magnet-optical disk, a memory card, a flexible disk, or the like. The program is read in a memory unit 101 by a predetermined reading device and is installed inside the control unit 100.

(Method of Depositing Film)

Next, a method of depositing a film of the first embodiment of the present invention using the film deposition apparatus illustrated in FIGS. 1 to 5 is described.

Figure 6:
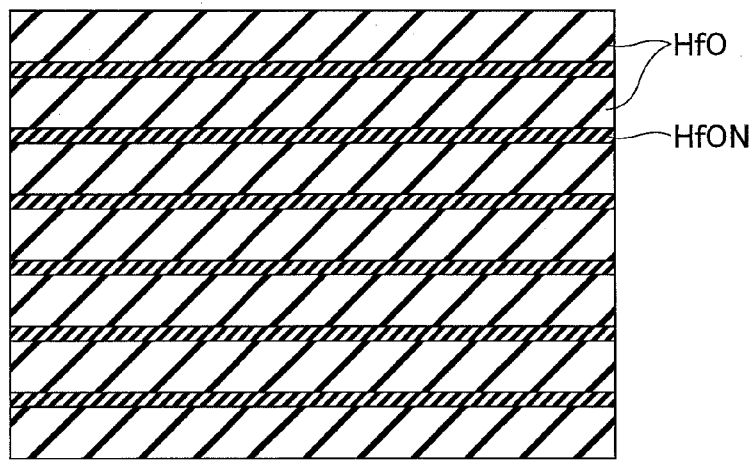
FIG. 6 illustrates an example of a HfON film obtained by a method of depositing a film of the first embodiment of the present invention.

FIG. 6 illustrates an example of a HfON film obtained by a method of depositing the film of the first embodiment of the present invention.

Referring to FIG. 6, HfO films and HfON films are alternately formed. This means a plurality of HfON layers doped with nitrogen (N) element are formed as upper layers of the HfO layers.

Figure 7:
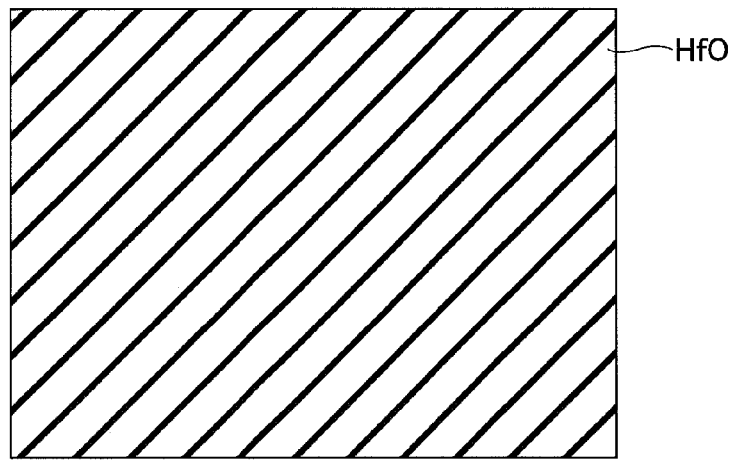
FIG. 7 illustrates an example of a single film of HfO, which is a base of the HfON film.

FIG. 7 illustrates an example of a single film of HfO, which is a base of the HfON films. As illustrated in FIG. 7, the HfO film is a single film and is made of only HfO.

Referring back to FIG. 6, the HfON layers are formed at a predetermined interval into the HfO film as the base. In an actual film deposition process, the HfO film having a predetermined film thickness is deposited, a HfON layer is formed on the uppermost layer of the deposited HfO film by doping with N, subsequently another HfO layer is formed, and another HfON layer is formed on the uppermost layer of the other HfO film by doping with N. Thus, the HfON film illustrated in FIG. 6 is formed. Within the first embodiment, referring to FIG. 6, a process of forming the HfO film having many layers by doping with nitrogen (hereinafter, N) is described.

Referring to FIG. 6, for convenience of illustration, borders between the HfO layers and the HfON layers are clearly distinguished. However, in an actual configuration, the concentration of N in each HfON layer gradually decreased at a lower position. Therefore, the borders between the HfO layers and the HfON layers become more fuzzy than that illustrated in FIG. 6. Further, the HfON film is a so-called High-k film having a high electric permittivity.

Figure 8:
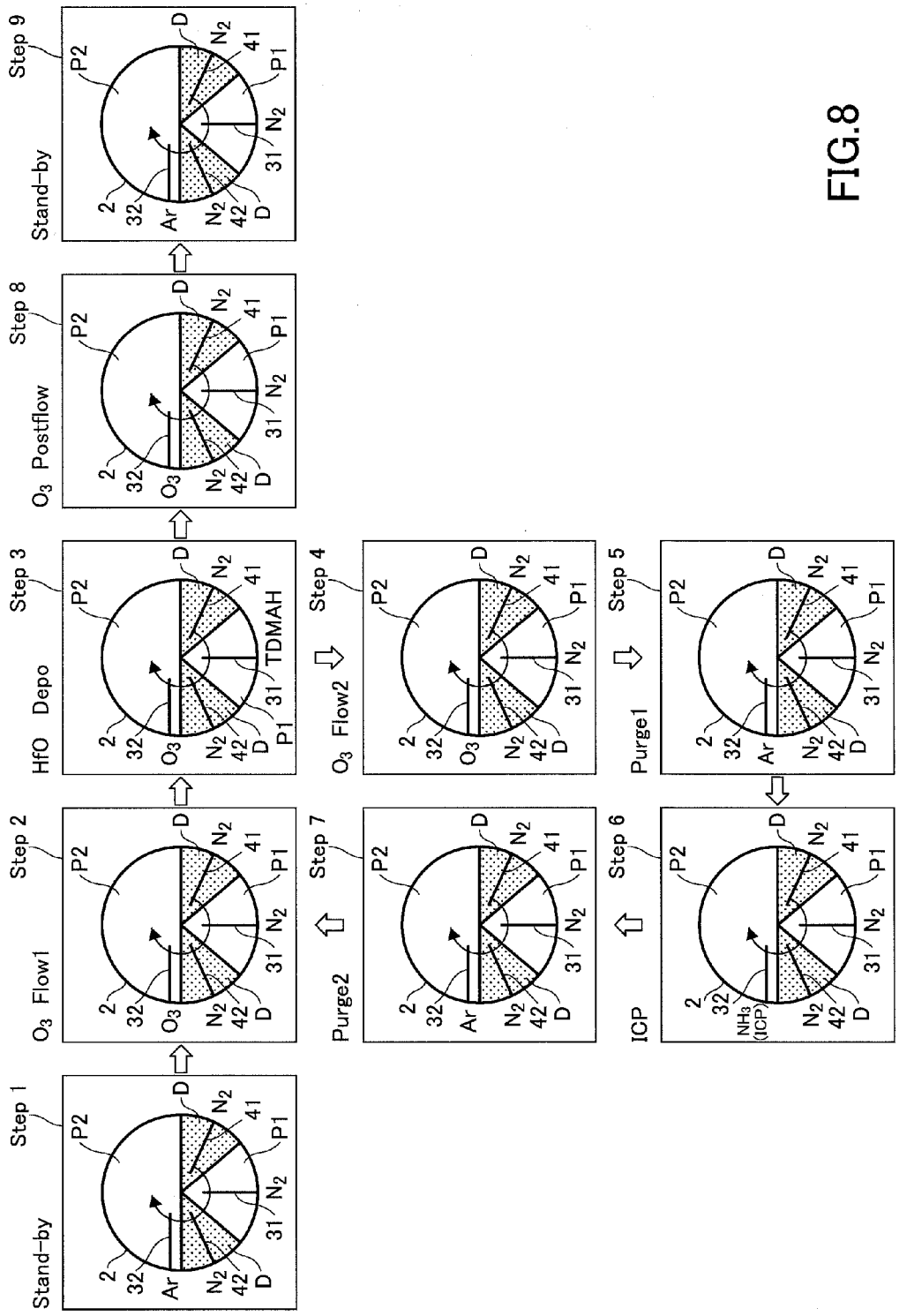
FIG. 8 is a sequential diagram illustrating an example of the method of depositing the film of the first embodiment of the present invention.

FIG. 8 is a sequential diagram illustrating an example of the method of depositing the film of the first embodiment of the present invention. Referring to FIG. 8, the turntable 2, the first process area P1 and the reaction gas nozzle 31, the second process area P2 and the reaction gas nozzle 32, the separating area D, and the separation gas nozzles 41 and 42 are simply illustrated.

Before performing the film deposition process illustrated in FIG. 8, it is necessary that the wafer W is transferred into the chamber 1 and mounted on the turntable 2. For this, at first, a gate valve (not illustrated) is opened. The wafer W is served into the circular concave portion 24 of the turntable 2 through the transfer opening 15 (FIG. 3) by the transfer arm 10. When the circular concave portion 24 is stopped at a position facing the transfer port 15, the lift pin (not illustrated) lifts up or down from the bottom portion side of the chamber 1 through the through hole in the bottom surface of the circular concave portion 24 to serve or receive the wafer W. The wafer W is served and received while the turntable 2 is intermittently rotated to thereby mount the wafers W inside five of the circular concave portions 24.

Subsequently, the gate valve is closed, and the chamber 1 is evacuated by the vacuum pump 640 to have a minimum degree of vacuum. From this state, the film deposition process illustrated in FIG. 8 is performed as follows.

Referring to FIG. 8, a stand-by process is performed in step 1. In the stand-by process, the $N_2$ gas being a separation gas is discharged from the separation gas nozzles 41 and 42 at a predetermined flow rate, and the $N_2$ gas is also discharged from the separation gas supplying pipe 51 and the purge gas supplying pipes 72, 72 at a predetermined flow rate (see FIG. 1). The $N_2$ gas is discharged from the reaction gas nozzle 31 at a predetermined flow rate, and the Ar gas is discharged from the reaction gas nozzle 32 at a predetermined flow rate. The Ar gas is a rare gas and a type of an inert gas. Although the $N_2$ gas is not a rare gas, the $N_2$ gas is one type of the inert gas. Resultantly, the inert gases are discharged from all nozzles 31, 32, 41, and 42. With this, the atmosphere inside the chamber 1 becomes an atmosphere of the inert gas. At this time, the pressure adjuster 650 adjusts the inside of the chamber 1 to have a predetermined process pressure. Subsequently, the wafer W is heated to be, for example, a range of 50° C. to 600° C. by the heater unit 7 while the turntable 2 is rotated at a predetermined rotational speed in a clockwise direction. With this, the stand-by state where the film deposition process is ready is prepared. The rotational speed of the turntable 2 is variable in a range of, for example, 1 rpm to 240 rpm depending on the intended use. However, in the method of depositing the film of the first embodiment, an example that the turntable 2 is rotated at the rotational speed of 6 rpm is explained.

Within the first embodiment, although the $N_2$ gas is discharged from the separation gas nozzles 41, 42 and the reaction gas nozzle 31, and the Ar gas is discharged from the reaction gas nozzle 32, a combination of the types of the inert gases may be properly changed depending on the intended use. For example, the rare gas such as an Ar gas or a He gas may be supplied from both of the reaction gas nozzles 31 and 32. Alternatively, the $N_2$ gas may be supplied from the reaction gas nozzle 32. This is similar in the separation gas nozzles 41 and 42. A desirable inert gas may be selected depending on the intended use.

In step 2, a flow process of flowing a first oxidation gas is performed. In the flow process of flowing the first oxidation gas, the $N_2$ gas is continuously supplied from the reaction gas nozzle 31 in the first process area P1 and the separation gas nozzles 41, 42. However, an $O_3$ gas is supplied as the oxidation gas from the reaction gas nozzle 32 into the second process area P2. The above state is maintained while the turntable 2 rotates by at least one turn. The wafer W continues to rotate at a predetermined rotational speed continuously from step 1. The rotational speed in the first embodiment is 6 rpm. The pre-flow process of the oxidation gas is a process of exposing the entire surface of the wafer W to the oxidation gas. As a preparation of the surface, the most upper surface of the wafer W is oxidized. With this, the wafer W is oxidized by supplying the $O_3$ gases onto a plurality of wafers W arranged along the peripheral direction of the turntable 2 to resultantly causing the plurality of wafers W to be substantially in the same condition. The reason why the turntable 2 is rotated by at least one turn is that the $O_3$ gas is supplied only from the reaction gas nozzle 32, and it is necessary to cause all the wafers W to pass through the lower area of the reaction gas nozzle 32 by at least the one turn of the turntable 2 in order to supply the $O_3$ gas onto the surfaces of all of the plurality of wafers W irrespective of the position of the reaction gas nozzle 32 relative to the plurality of wafers W.

The supply of the $O_3$ gas may be performed a plurality of turns in the wafer W as long as the process does not require a restriction of minimizing the oxidation. Therefore, the wafer W may be turned more than one turn under the state where the $O_3$ gas is being supplied. For example, the wafer W may be turned, for example, 2 or 3 turns or 1.5 turns having a fraction in the flow process of flowing the first oxidation gas.

Because the flow process of flowing the first oxidation gas is an oxidizing process performed before the film deposition process of forming HfO, the flow process of flowing the first oxidation gas may be called a pre-oxidizing process.

In step 3, the film deposition process of forming HfO is performed. In the film deposition process of forming HfO, a tetrakis(dimethylamino)hafnium (TDMAH) gas as one type of an organometallic gas containing Zr is supplied from the reaction gas nozzle 31 to the wafer W, and the $O_3$ gas is supplied from the reaction gas nozzle 32 to the wafer W. Said differently, the TDMAH gas and the $O_3$ gas are simultaneously supplied in the film deposition process of depositing HfO. However, because these gases are separated by the separating area D, they are hardly mixed inside the chamber 1.

When the TDMAH gas and the $O_3$ gas are simultaneously supplied, the TDMAH gas adsorbs onto the surface of the wafer W oxidized in the flow process of flowing the first oxidation gas at step 2 after the wafer W passes through the first process area P1 by the rotation of the turntable 2. At this time, because the surfaces of all the wafers W are oxidized by the flow process of flowing the first oxidation gas, the TDMAH gas can adsorb onto the surfaces of all the wafers W without problem. Subsequently, after the wafer W passes through the second process area P2, the TDMAH gas adsorbing onto the surface of the wafer W is oxidized by the $O_3$ gas. Thus, a HfO film (mainly, a molecular layer of HfO) is formed on the surface of the wafer W. Thereafter, the turntable 2 is rotated a predetermined number of times until the HfO film having a predetermined film thickness is formed. Said differently, in the film deposition process of forming HfO of step 3, the turntable 2 is repeatedly rotated until the HfO film has a predetermined film thickness. Because the HfO film equal to one layer is formed after the one turn of the turntable 2, it is possible to control the film thickness of the hafnium oxide (HfO) film by adjusting the number of turns.

Then, the film deposition process of forming HfO is finished by stopping the supply of the TDMAH gas and the $O_3$ gas. Because the supply of the TDMAH gas and the supply of the $O_3$ gas are substantially simultaneously stopped, at a stage of finishing the film deposition process of forming HfO of step 3, there are both the wafer W, onto the surface of which the TDMAH gas is adsorbing, and the wafer W, on which a HfO film is deposited after the $O_3$ gas is supplied after the TDMAH gas adsorbs onto the wafer W.

In step 4, a flow process of flowing a second oxidation gas is performed. In the flow process of flowing the second oxidation gas, the $N_2$ gas is supplied from the reaction gas nozzle provided in the first process area P1 and the separation gas nozzles 41 and 42 provided in the separating area D, and the $O_3$ gas is supplied from the reaction gas nozzle 32 provided in the second process area P2. Under this condition, the turntable 2 rotates at least one turn, and all the plurality of wafers mounted on the upper surface of the turntable 2 are exposed to the $O_3$ gas. With this, the wafer W, whose film deposition process of forming HfO of step 3 is finished while completely passing through the second process area P2 in the process of flowing the second oxidation gas, inevitably passes through the second process area P2 in the flow process of flowing the second oxidation gas. Then, the oxidation process is performed to thereby deposit the HfO film. Thus, the film deposition process of forming the HfO film can be completely finished.

The flow process of flowing the second oxidation gas is a film deposition process performed immediately after the film deposition process of forming HfO. Therefore, the flow process of flowing the second oxidation gas may be referred to as a post-oxidizing process.

The flow process of flowing the first oxidation gas in step 2 and the flow process of flowing the second oxidation gas in step 4 may be performed using the same number of turns or different numbers of turns. From a point of view of enhancing the throughput, each process of the flow process of flowing the first oxidation gas in step 2 and the flow process of flowing the second oxidation gas in step 4 may be performed by one turn, for example. Because the flow process of flowing the first oxidation gas and the flow process of flowing the second oxidation gas are mutually independent, the numbers of turns for these processes can be arbitrarily determined depending on the intended use.

In step 5, a first purge process is performed. In the first purge process, the turntable 2 is rotated a predetermined number of times while the $O_3$ gas is evacuated, the $N_2$ gas is supplied from the reaction gas nozzle 31, an Ar gas is supplied from the reaction gas nozzle 32, and the $N_2$ gas as the separation gas is continuously supplied from the separation gas nozzles 41 and 42 to make the inside of the chamber 2 be an atmosphere of inert gas. Therefore, the $O_3$ gas is removed from the inside of the chamber 1 and oxidation of the HfO film is once stopped. Referring to FIG. 8, the $N_2$ gas is supplied from the reaction gas nozzle 31, and the Ar gas is supplied from the reaction gas nozzle 32. However, this $N_2$ gas and this Ar gas can be variously selected from inert gases including the $N_2$ gas and the rare gas. Combinations of the gases can be arbitrarily determined. Further, the number of turns of the turntable 2 may be any as long as the inside of the chamber can be made the atmosphere of inert gas.

In step 6, a process of doping with nitrogen is performed. In the process of doping with nitrogen, the turntable 2 is rotated a predetermined number of times to dope nitrogen onto the surface of the HfO film while the $N_2$ gas is supplied from the reaction gas nozzle 31, a $NH_3$ gas is supplied from the reaction gas nozzle 32, and the $N_2$ gas is supplied from the separation gas nozzles 41 and 42. Although $NH_3$ is supplied as a nitriding gas, a plasma process may be performed as needed. Inside the chamber, the above process is performed at a relatively low temperature of about 300° C. If the temperature is about 300° C., nitrogen is not sufficiently activated. Therefore, in order to change nitrogen to a radical, a plasma process is applied to the $NH_3$ gas supplied from the reaction gas nozzle 32 to supply a $NH_4^+$ ion, which has been changed to the radical, on the surface of the HfO film. With this, the reaction of nitrogen is promoted to appropriately dope with nitrogen.

The plasma process can be performed by various methods. For example, an inductively coupled plasma (ICP) method may be used to produce plasma by an inductive magnetic field, which is generated by a radio frequency (RF) coil.

The number of turns of the turntable 2 may be set to a predetermined number of times necessary for performing the required doping of N. The radical of nitrogen has a relatively short life span. Therefore, it is not easy to nitride HfO. Therefore, in consideration of difficulty of the nitriding reaction in the process of doping with nitrogen, the process of doping with nitrogen may be limited to an extent necessary for doping with N of a predetermined amount.

The doping means an addition of an impurity of a minute amount. In the first embodiment, N of a minute amount is added to the HfO film.

In step 7, a second purge process is performed. In the second purge process, the turntable 2 is rotated a predetermined number of times while the Ar gas is supplied from the reaction gas nozzle 31 in a manner similar to the first purge process, the $N_2$ gas is supplied from the reaction gas nozzle 32, and the $N_2$ gas is supplied from the separation gas nozzles 41 and 42. By the second purge process, nitrogen doped in the process of doping with nitrogen is fixed onto the HfO film. In the second purge process, a gas supplied from the reaction gas nozzles 31 and 32 can be variously selected from inert gases.

After the second purge process of step 7, the flow process of flowing the first oxidation gas of step 2 is performed again. As described above, in the flow process of flowing the first oxidation gas, the turntable 2 is rotated at least one turn while the $N_2$ gas is supplied from the reaction gas nozzle 31, the $N_2$ gas is supplied from the reaction gas nozzle 31, the $O_3$ gas is supplied from the reaction gas nozzle 32, and the $N_2$ gas is supplied from the separation gas nozzles 41 and 42. With this, the surface of the wafer W is oxidized, and the deposition process of forming HfO is performed after the oxidation.

The process of steps 2 to 7 forms one cycle, and the cycle is repeated a necessary number of times to thereby form the multilayer structure including the HfON layers illustrated in FIG. 6. With this, the multilayer structure of the HfON layers can be formed where the surfaces of the HfO layers are doped by N to form the HfON layers.

After repeating the cycles of steps 2 to 7, the flow process of flowing the first oxidation gas of step 2 and the film deposition process of forming HfO of step 3 are performed one time each. Thereafter, a flow process of flowing a third oxidation gas is performed.

The flow process of flowing the third oxidation gas is a process similar to the flow process of flowing the second oxidation gas and oxidizes all the TDMAH gas adsorbing on the surface of the wafer W in the final film deposition process of forming HfO. Therefore, the $O_3$ gas is supplied from the reaction gas nozzle 32, and simultaneously the $N_2$ gas is supplied from the reaction gas nozzle 31 and the separation gas nozzles 41 and 42 to oxidize the surface of the wafer W.

The flow process of flowing the third oxidation gas may be performed for a time duration longer than that of the flow process of flowing the first oxidation gas or that of the flow process of flowing the second oxidation gas to improve the film quality of the HfO film. With this, oxygen is sufficiently supplied to the formed HfO film to thereby improve the film quality of the HfO film.

Further, as to the oxidation gases used in the flow process of flowing the first oxidation gas, the flow process of flowing the second oxidation gas, the flow process of flowing the third oxidation gas, and the film deposition process of forming HfO, examples using the $O_3$ gas are mentioned in reference to FIG. 8. These oxidation gases may be, for example, a gas including water ($H_2O$), oxygen, oxygen radical, or the like.

In the stand-by process of step 9, the wafer W is rotated while the inert gases are supplied from all the nozzles 31, 32, 41, and 42 such that the $N_2$ gas is supplied from the reaction gas nozzle 31, the Ar gas is supplied from the reaction gas nozzle, and the $N_2$ gas is supplied from the separation gas nozzles 41 and 42. Then, the final flow process of flowing the oxidation gas is finished and the process returns to the stand-by state again. With this, the film deposition process of forming HfON is finished.

The first purge process described in step 5 and the second purge process described in step 7 are not always necessary and may be provided as needed. In order to properly perform the process of doping with nitrogen in step 6, it is preferable to provide the first and second purge processes before and after the process of doping with nitrogen.

In a manner similar thereto, it is preferable to provide the first and second purge processes before and after the flow process of flowing the first oxidation gas in step 2, the flow process of flowing the second oxidation gas in step 4, and the flow process of flowing the third oxidation gas in step 8 for properly performing film the deposition process of forming HfO. However, in a case where the HfO film is properly formed in the film deposition process of forming HfO by considering other conditions or the like, these first and second purge processes can be omitted.

As described, within the method of depositing the film of the first embodiment, by providing the process of doping the HfO film having the formed oxide film with N, it is possible to securely distribute the doped N into the HfO film. Thus, the HfON film can be formed while maintaining high productivity of the turntable type.

Second Embodiment

Figure 9:
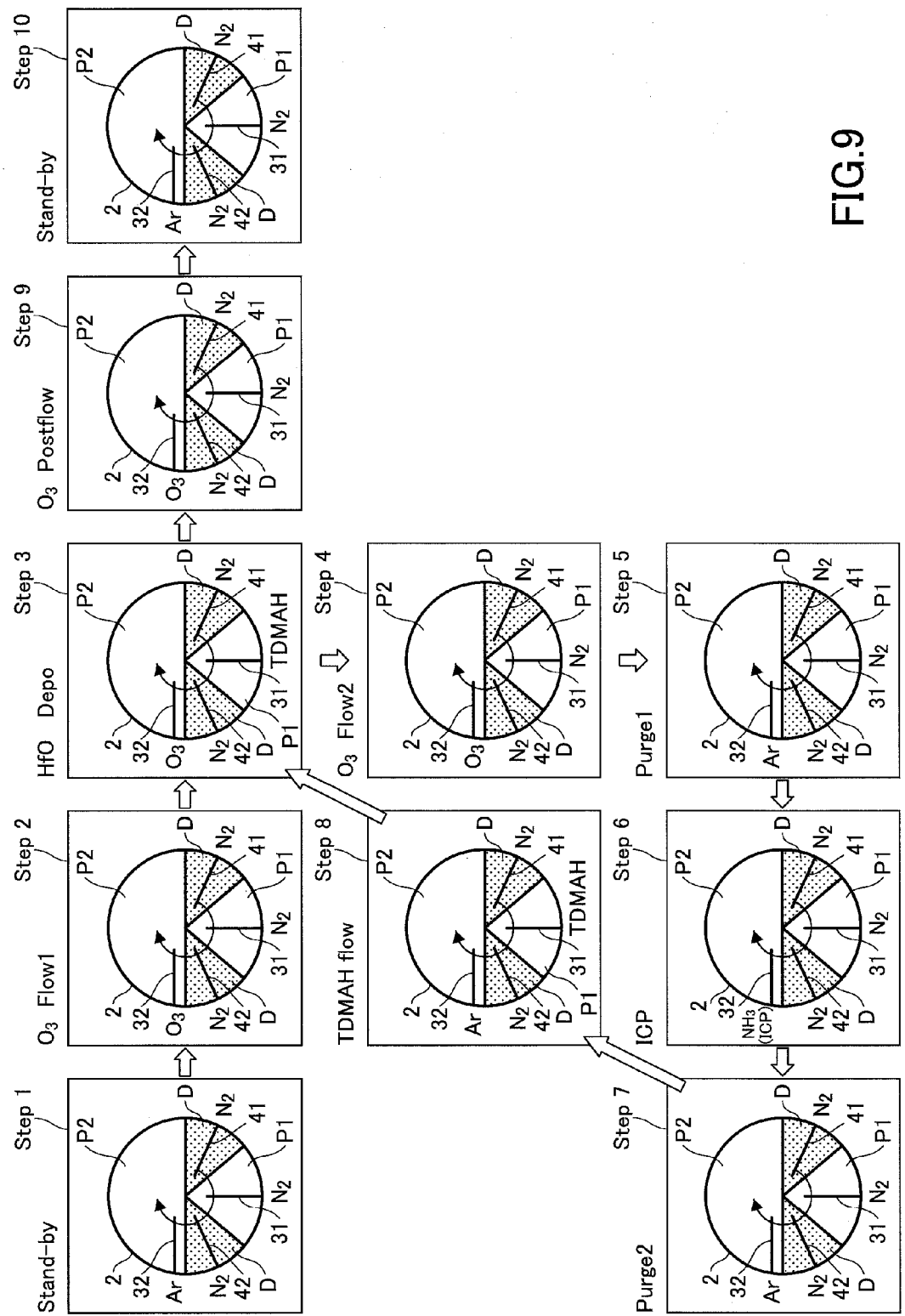
FIG. 9 is a sequential diagram illustrating an example of the method of depositing a film of a second embodiment of the present invention.

FIG. 9 is a sequential diagram illustrating an example of a method of depositing a film of a second embodiment of the present invention. Within the second embodiment, the HfON film illustrated in FIG. 6 is formed by a method of depositing the film different from that of the first embodiment. Within the second embodiment, the film deposition apparatus is the same as that in the first embodiment. A film deposition apparatus similar to the deposition apparatus in the first embodiment is used in the following embodiments.

Referring to FIG. 9, a stand-by process is performed in step 1. Because the stand-by process is similar to the stand-by process of step 1 of the first embodiment, an explanation of the stand-by process is omitted. Because a process of transferring the wafer W before the stand-by process is similar to that in the first embodiment, the description of the process is omitted.

A flow process of flowing the first oxidation gas (a pre-oxidizing process) of step 2, a film deposition process of forming HfO of step 3, a flow process of flowing the second oxidation gas (a post-oxidizing process) of step 4, a first purge process of step 5, a process of doping with nitrogen of step 6, and a second purge process of step 7 are similar to steps 2 to 7 of the method of depositing the film of the first embodiment, description thereof is omitted.

In step 8, a process of supplying the Hf raw gas is performed. In the process of supplying the Hf raw gas, the turntable 2 is rotated predetermined times while the TDMAH gas being the raw gas of Hf is supplied from the reaction gas nozzle 31, the Ar gas is supplied from the reaction gas nozzle 32, and the N2 gas is supplied from the separation gas nozzles 41 and 42.

As described in the first embodiment, nitrogen is hardly activated in the process of doping with nitrogen in step 6 presumably because of a low temperature process at about 300° C. On the other hand, the $O_3$ gas is sufficiently activated at about 300° C. so as to be easily reacted. Under the condition, the second purge process of step 7 directly moves to the film deposition process of forming HfO of step 3. When the $O_3$ gas is continuously supplied, because the reaction of the $O_3$ gas is more active than the reaction of N, N may be extinguished without remaining on the surface of the wafer W. In this case, the N dope is not properly performed.

In order to prevent the state from occurring, the process of supplying the HF raw gas is provided to weaken the reaction of the $O_3$ gas. By supplying the TDMAH gas so as to adsorb onto the surface of the wafer W, there is a great quantity of the TDMAH gas to be oxidized. Therefore, it is possible to prevent nitrogen from being extinguished and dispersed.

Because the process of supplying the Hf raw gas is provided for this purpose, the turntable 2 is rotated a requisite predetermined number of times so that the doped nitrogen appropriately remains in the process of supplying the Hf raw gas.

As described, by providing the process of supplying the Hf raw gas after the process of doping with nitrogen, doping of nitrogen is further ensured.

In the method of depositing the film of the second embodiment, one cycle is formed by the film deposition process of forming HfO of step 3 to the process of supplying the Hf raw gas of step 8, and the cycle is repeated a predetermined number of times necessary for depositing the HfON film having the multilayer structure illustrated in FIG. 6. With this, the HfON film having the multilayer structure illustrated in FIG. 6 in a manner similar to the method of depositing the film of the first embodiment.

After repeating the cycles of step 3 to step 8 the predetermined number of times, the film deposition process of forming HfO of step 3 is once performed and the process moves, to the flow process of flowing the third oxidation gas of step 9.

Because the flow process of flowing the third oxidation gas of step 9 is similar to the flow process of flowing the third oxidation gas of step 8 of the first embodiment, description of the flow process of flowing the third oxidation gas is omitted.

In step 10, a stand-by process is performed. Because the stand-by process of step 10 is similar to the stand-by process of step 9 of the first embodiment, description of the stand-by process of step 10 is omitted.

The first and second purge processes, the flow process of flowing the first oxidation gas, the flow process of flowing the second oxidation gas, and the flow process of flowing the third oxidation gas can be properly omitted depending on usage, conditions, or the like. This is similar to the method of depositing the film of the first embodiment.

Within the method of depositing the film of the second embodiment, N can be prevented from being extinguished or dispersed after the process of doping with nitrogen. Therefore, the HfON film having the multilayer structure can be securely deposited.

Third Embodiment

Figure 10:
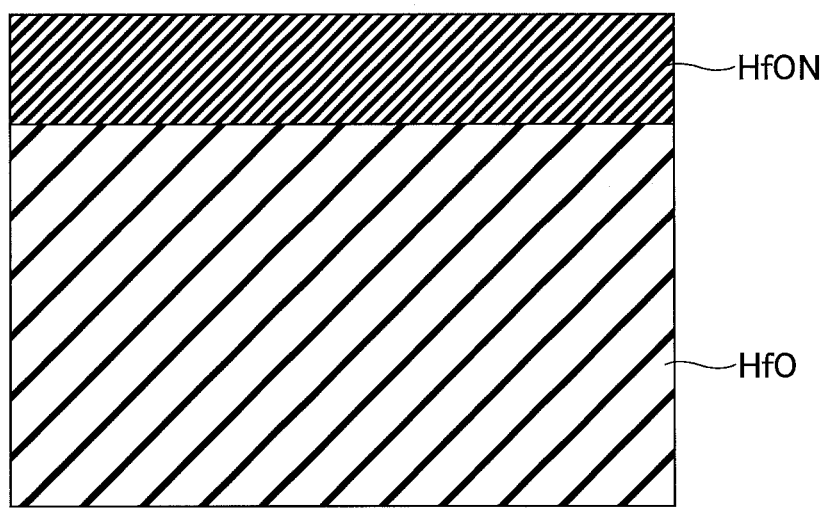
FIG. 10 illustrates an example of a HfON film obtained by a method of depositing a film of a third embodiment of the present invention.

FIG. 10 illustrates an example of a HfON film obtained by a method of depositing the film of the third embodiment of the present invention. In the method of depositing the film of the third embodiment, described is a method of depositing not the HfON film having the multilayer structure of the first and second embodiments but a HfON film having a structure where N is doped (added) on the upper surface of a HfO film having a single film structure illustrated in FIG. 7.

Because a film deposition apparatus used for the method of depositing the film of the third embodiment is similar to the film deposition apparatus used for the method of depositing the film of the first and second embodiments, description of the film deposition apparatus used for the method of depositing the film of the third embodiment is omitted.

Figure 11:
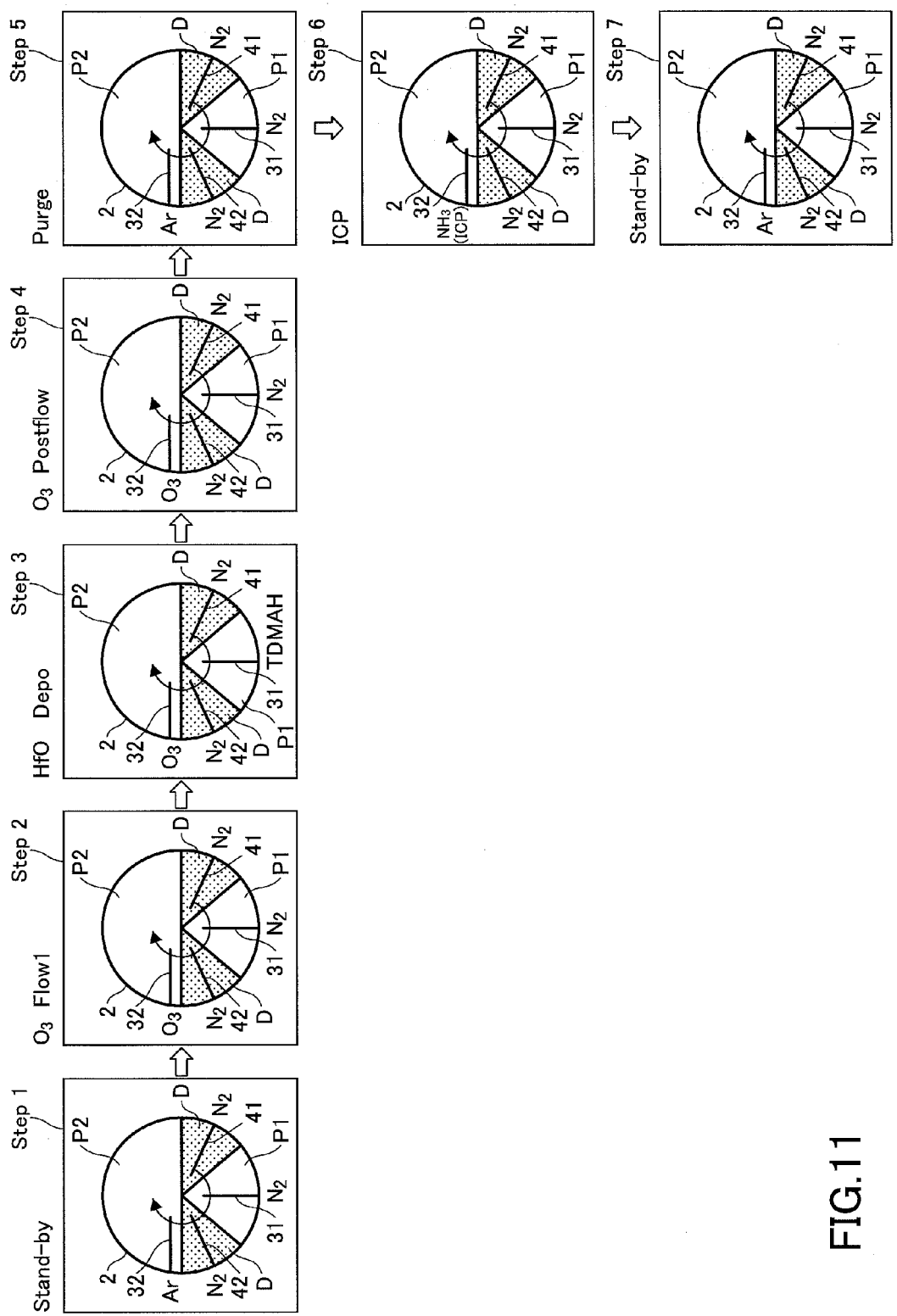
FIG. 11 is a sequential diagram illustrating an example of the method of depositing the film of the third embodiment of the present invention.

FIG. 11 is a sequential diagram illustrating an example of the method of depositing the film of the third embodiment of the present invention. FIG. 11 illustrates a stand-by process of step 1, a flow process of flowing the first oxidation gas (a pre-oxidizing process) of step 2, a film deposition process of forming HfO of step 3, a flow process of flowing the second oxidation gas (a post-oxidizing process) of step 4, a first purge process of step 5, a process of doping with nitrogen of step 6, and a purge process of step 7. Steps 1 to 6 are similar to steps 1 to 6 in the sequential diagram illustrated in FIG. 8 of the first embodiment.

The stand-by process of step 7 in FIG. 11 is similar to the second purge process of step 7 in FIG. 8. though names are different. A sequence of the method of depositing the film of the third embodiment corresponds to a process of steps 1 to 7 of the method of depositing the film of the first embodiment illustrated in FIG. 8 performed only one cycle. Therefore, description of specific contents of the steps is omitted.

However, within the method of depositing the film of the third embodiment, because the single film of the HfO film is made thick, the time of the film deposition process of forming HfO of step 3 is substantially longer than the time of the single deposition process of forming HfO of step 3 of the method of depositing the film of the first embodiment. Within the film deposition process of forming HfO in step 3 of the method of depositing the film of the third embodiment, the HfO film is repeatedly deposited by rotating the turntable 2 required predetermined times for depositing the HfO film of the thick HfO film illustrated in FIG. 7. In this point of view, the method of depositing the film of the first embodiment differs from the method of depositing the film of the third embodiment.

As known from a comparison between FIGS. 6 and 10, the film thickness of the HfON layer of the third embodiment is thicker than the film thickness of the HfON layer of the first embodiment. Therefore, the process of doping with nitrogen of step 6 in the method of depositing the film of the third embodiment is performed for a longer time duration than the process of doping with nitrogen of step 6 in the method of depositing the film of the first embodiment. With this, nitrogen is doped (added) on the upper surface of the single film of the HfO film to thereby form the HfON film having the structure formed with the HfON layer.

Because the other processes and the process times are similar to those of the method of depositing the film of the first embodiment, description thereof is omitted.

As to the stand-by process of step 7, which is finally performed, after performing steps 1 to 6 in the sequence of the method of depositing the film of the first embodiment, the process may jump to the stand-by process of step 9 of the first embodiment as the stand-by process of the method of depositing the film of the third embodiment. The stand-by processes of step 9 of the first embodiment and the stand-by processes of step 7 of the third embodiment are the purge processes. In these purge processes, the turntable 2 is rotated while the Ar gas is supplied from the reaction gas nozzles 32 and the $N_2$ gas is supplied from the separation gas nozzles 41 and 42. Because there are no substantial difference between these purge processes, the stand-by processes of step 9 of the first embodiment or the stand-by processes of step 7 of the third embodiment can work as the final process.

The first purge process, the final stand-by process, the flow process of flowing the first oxidation gas, and the flow process of flowing the second oxidation gas can be properly omitted depending on usage, conditions, or the like. This is similar to the method of depositing the film of the first embodiment.

Within the method of depositing the film of the third embodiment, a HfON film having a simple structure can be deposited by a simple sequence.

Fourth Embodiment

Figure 12:
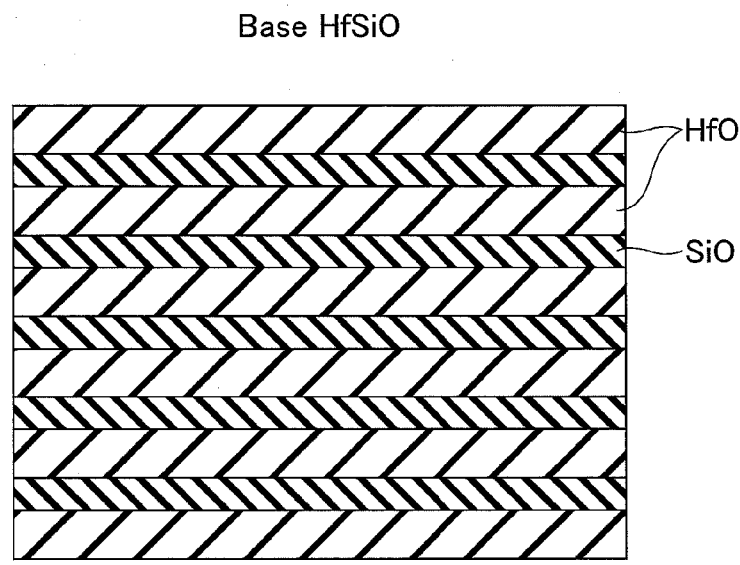
FIG. 12 illustrates an example of a HfSiO film to be doped with nitrogen by a method of depositing a film of a fourth embodiment of the present invention.

FIG. 12 illustrates an example of a HfSiO film to be doped with nitrogen by a method of depositing a film of a fourth embodiment of the present invention. The HfSiO film is a composite oxide film containing two types of elements of Hf and Si in addition to oxygen. As illustrated in FIG. 12, the HfSiO film has a laminate structure where a plurality of HfO films and a plurality of SiO layers and a plurality of SiO layers are alternately laminated. When the HfO layers and the SiO layers form a laminate structure, in most cases, the HfO layers are a main body, and the thicknesses of the SiO layers are thinner than the thicknesses of the HfO layers. Accordingly, referring to FIG. 12, the he thicknesses of the SiO layers are illustrated to be thinner than the thicknesses of the HfO layers. Within the method of depositing the film of the fourth embodiment, described is the method of depositing the film where a multi-element oxide film having a laminate structure formed by laminating oxide films of a plural types of elements is doped with nitrogen.

Figure 13:
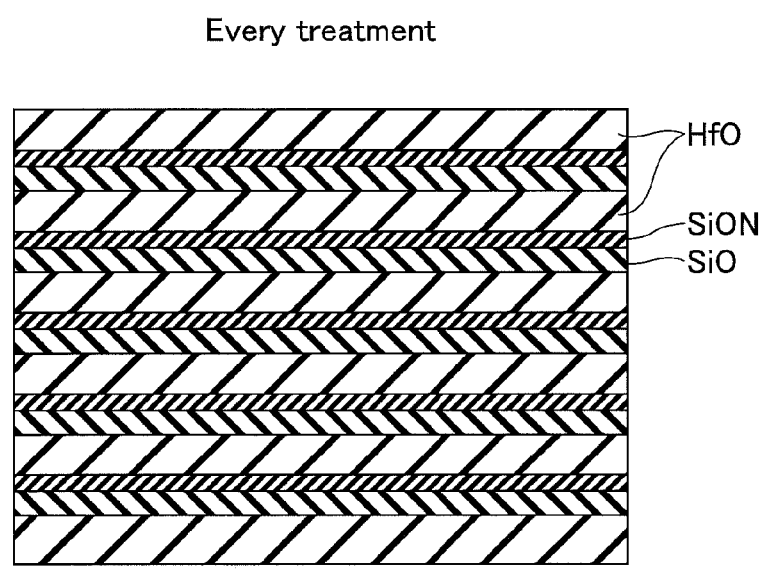
FIG. 13 illustrates an example of a HfSiON film obtained by the method of depositing the film of the fourth embodiment of the present invention.

FIG. 13 illustrates an example of a HfSiON film obtained by a method of depositing the film of the fourth embodiment of the present invention. Within the method of depositing the film of the fourth embodiment, nitrogen is doped on the upper surfaces of the SiO layers to form the HfSiON film. Within the method of depositing the film of the fourth embodiment, described is the method of depositing the film where a plurality of HfSiON layers laminated to form one HfSiON film as a whole.

Figure 14:
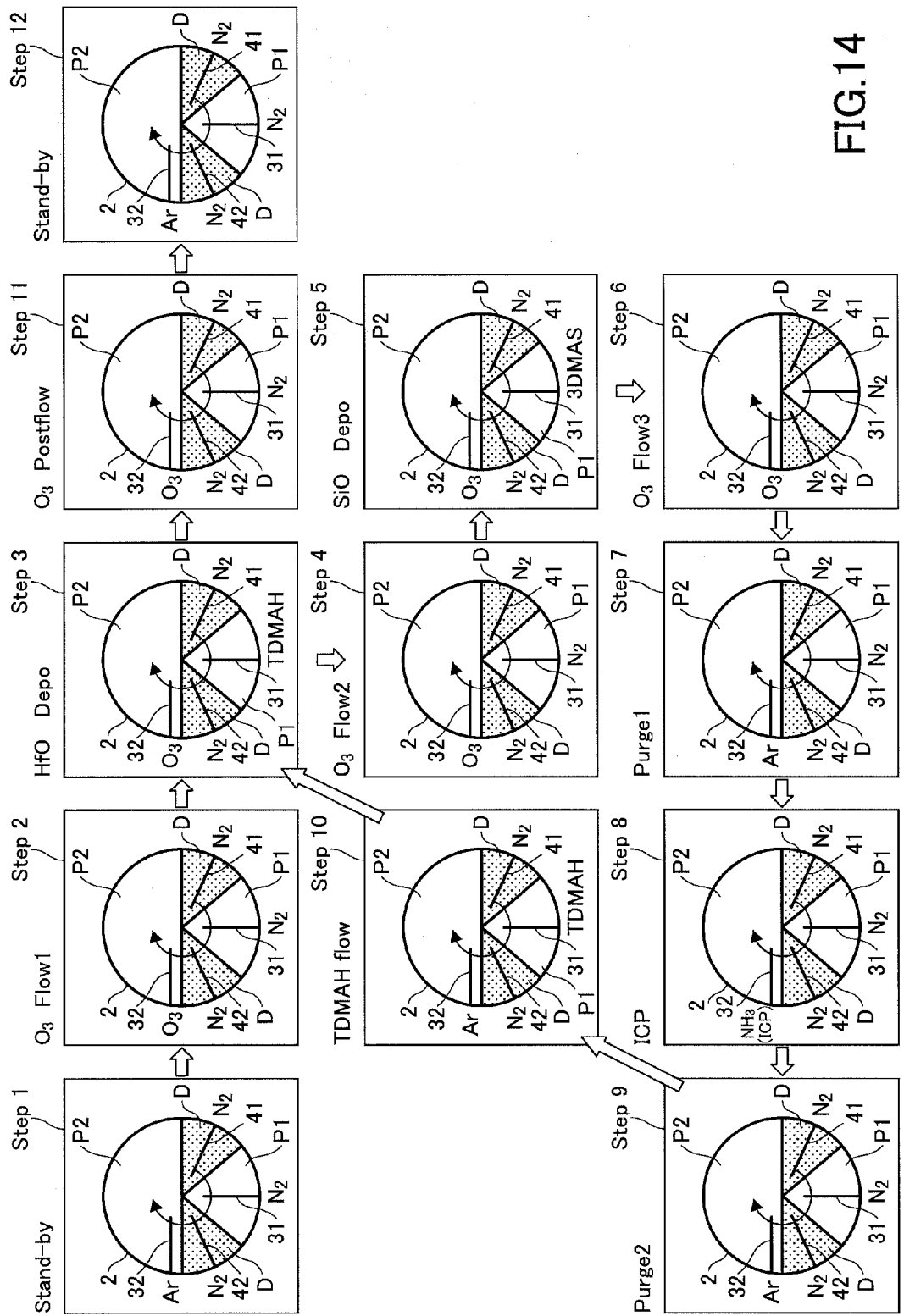
FIG. 14 is a sequential diagram illustrating an example of the method of depositing the film of the fourth embodiment of the present invention.

FIG. 14 is a sequential diagram illustrating an example of a method of depositing a film of fourth embodiment of the present invention. Referring to FIG. 14, because a stand-by process of step 1, a flow process of flowing the first oxidation gas of step 2, a film deposition process of forming HfO of step 3, and a flow process of flowing the second oxidation gas of step 4 are similar to steps 1 to 4 illustrated in FIG. 8 in the method of depositing the film of the first embodiment, description of the processes of steps 1 to 4 is omitted.

In step 5, a film deposition process of forming silicon oxide (SiO) is performed. In the film deposition process of depositing SiO, tri (dimethylaminosilane) (3DMAS) gas is supplied from the reaction gas nozzle 31 of the first process area P1 and the $O_3$ gas is supplied from the reaction gas nozzle 32 of the second process area P2. Further, the $N_2$ gas is supplied from the separation gas nozzles 41 and 42. Under the state, the turntable 2 is rotated a predetermined number of times to form a SiO layer on a HfO layer.

In the film deposition process of depositing SiO, 3DMAS being a raw gas containing Si is supplied from the reaction gas nozzle 31 in the first process area P1 so that the 3DMAS gas adsorbs onto the HfO layer. After the $N_2$ gas is supplied from the separation gas nozzle 42 in the separating area D during the rotation of the turntable 2 to purge the separating area D, an $O_3$ gas is supplied from the reaction gas nozzle 32 in the second process area P2. Inside the second process area P2, the 3DMAS gas adsorbing on the HfO layer is oxidized to form a SiO layer (mainly, a $SiO_2$ layer). After forming the SiO layer, the $N_2$ gas is supplied from the separation gas nozzle 41 to purge the separating area D and the 3DMAS gas is supplied into the first process area P1. This cycle of the supplies of the $N_2$ gas and the 3DMAS gas is repeated. The above cycle of forming each molecular layer of SiO each rotation is repeated until a SiO layer having a predetermined film thickness is obtained. As described, the SiO layer having the predetermined film thickness is obtained in the film deposition process of depositing SiO.

In step 6, the flow process of flowing the third oxidation gas is performed. The flow process of flowing the third oxidation gas is performed to expose a wafer W, on the surface of which the 3DMAS gas finally adsorbs among a plurality of wafers mounted on the turntable 2, to an oxidation gas to oxidize all the 3DMAS gas to form the SiO layer. The flow process of flowing the third oxidation gas is similar to the flow process of flowing the second oxidation gas of step 4. The flow process of flowing the third oxidation gas is a post-oxidizing process corresponding to the film deposition process of depositing SiO. Because the content of the process is similar to that of the flow process of flowing the second oxidation gas in step 4 illustrated in FIG. 8 of the first embodiment, description of the flow process of flowing the second oxidation gas is omitted.

Because a first purge process of step 7, a process of doping with nitrogen of step 8, a second purge process of step 9, and a process of supplying a Hf raw gas of step 10 are similar to steps 5 to 8 illustrated in FIG. 9 of the method of depositing the film of the second embodiment, description of steps 7 to 10 is omitted. More specifically, the first purge process of step 7, the process of doping with nitrogen of step 8, and the second purge process of step 9 are similar to steps 5 to 7 illustrated in FIG. 8 of the method of depositing the film of the first embodiment.

One cycle is formed by the film deposition process of depositing of step 3 to the process of supplying the Hf raw gas of step 10. By repeating the cycle, the HfSiON film of the multilayer illustrated in FIG. 13 is formed. Each HfSiON layer is formed during each cycle. The HfSiON film of the multilayer structure is obtained by forming a required number of the HfSiON layers.

During each cycle, processes from the process of supplying the Hf raw gas of step 10 to the flow process of flowing the second oxidation gas of step 6 are provided to form the HfSiO layer illustrated in FIG. 12, and processes from the first purge process of step 7 to the second purge process of step 9 are provided to dope nitrogen onto the SiO layer. As to the film deposition process, more specifically, processes from the process of supplying the Hf raw gas of step 10 to the flow process of flowing the second oxidation gas of step 4 are provided to deposit the HfO layer, and processes from the flow process of flowing the second oxidation gas of step 4 and the flow process of flowing the third oxidation gas of step 4 are provided to deposit the SiO layer. The flow process of flowing the second oxidation gas of step 4 functions as a post-oxidizing process of the film deposition process of forming HfO of step 3 and also functions as a pre-oxidizing process of the film deposition process of depositing SiO of step 5.

As described, when an oxide layer containing one type of two types of element and the other oxide layer containing the other type of the element are laminated (a laminate structure of the oxide layers containing two types of different elements is formed), the post-oxidizing process after the film deposition process of depositing the first oxide film and the pre-oxidizing process before the film deposition process of depositing the second oxide film can be made common. Therefore, the number of the oxidizing processes can be decreased as a whole. Further, the process of doping with nitrogen is provided after the film deposition process of depositing the second oxide film and is included in the one cycle. Thus, along with the rotation of the turntable 2, the many HfSiON layers forming the composite oxide film doped with N are formed. Thus, the HfSiON film having the multilayer structure is obtainable. Further, by providing the process of supplying the Hf raw gas after doping with nitrogen, certainty in doping with nitrogen can be enhanced.

As described, by establishing the cycle of continuously rotating the turntable 2 and sequentially switching the supplying gases, the HfSiON film having the predetermined thickness can be obtained with high productive efficiency.

The processes from the film deposition process of forming HfO of step 3 to the process of supplying the Hf raw gas of step 10 are repeated the predetermined number of times to form the HfSiON having the required number of layers, the film deposition process of forming HfO of step 3 is performed once. Thereafter, the process goes to a flow process of flowing a fourth oxidation gas.

Because the flow process of flowing the fourth oxidation gas of step S11 is similar to the flow process of flowing the third oxidation gas in step 3 illustrated in FIG. 9 of the second embodiment and the flow process of flowing the third oxidation gas in step 8 illustrated in FIG. 8 of the first embodiment, description of the flow process of flowing the fourth oxidation gas is omitted.

Because the stand-by process of step S12 is similar to the stand-by process in step 10 illustrated in FIG. 9 of the method of depositing the film of the second embodiment and the stand-by process in step 9 illustrated in FIG. 8 in the method of depositing the film of the first embodiment, description of the stand-by process is omitted.

The first and second purge processes, the flow process of flowing the first oxidation gas, the flow process of flowing the second oxidation gas, the flow process of flowing the third oxidation gas, or the flow process of flowing the fourth oxidation gas can be omitted depending on usage and conditions. This is similar to the first to third embodiments.

Within the method of depositing the film of the fourth embodiment, the oxide layer having the laminate structure and doped with nitrogen can be securely formed with high productivity.

Fifth Embodiment

Figure 15:
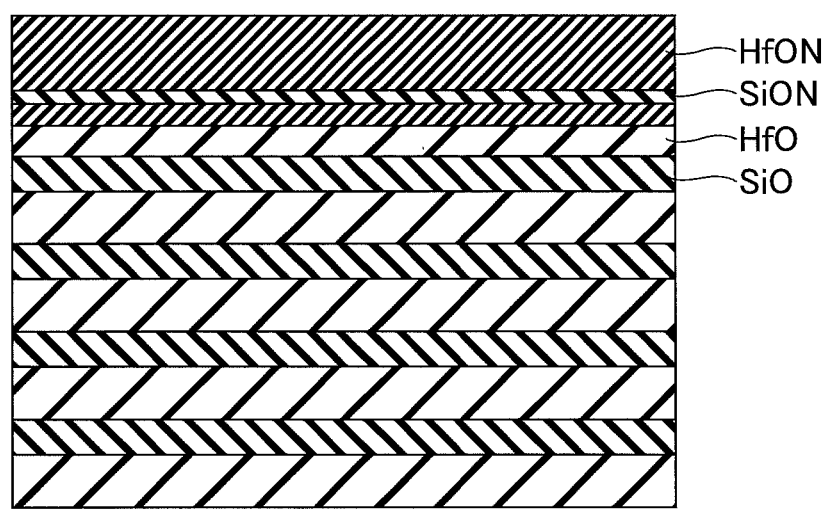
FIG. 15 illustrates an example of a HfSiON film obtained by a method of depositing a film of a fifth embodiment of the present invention.

FIG. 15 illustrates an example of a HfSiON film obtained by a method of depositing the film of the fifth embodiment of the present invention. Referring to FIG. 15, the HfSiON film formed by the method of depositing the film of the fifth embodiment has a laminate structure including HfO layers and SiO layers in a manner similar to the method of depositing the film of the fourth embodiment illustrated in FIG. 13. However, the HfSiON film of the fifth embodiment differs from the HfSiON film of the fourth embodiment illustrated in FIG. 13 at points that doped nitrogen exists in the vicinity of the upper surface of the HfSiON film, and a HfON layer and a SiON layer are formed in the vicinity of the upper surface of the HfSiON film. As described, the film may be formed so that nitrogen is doped only in the vicinity of the upper surface of the entire film.

Figure 16:
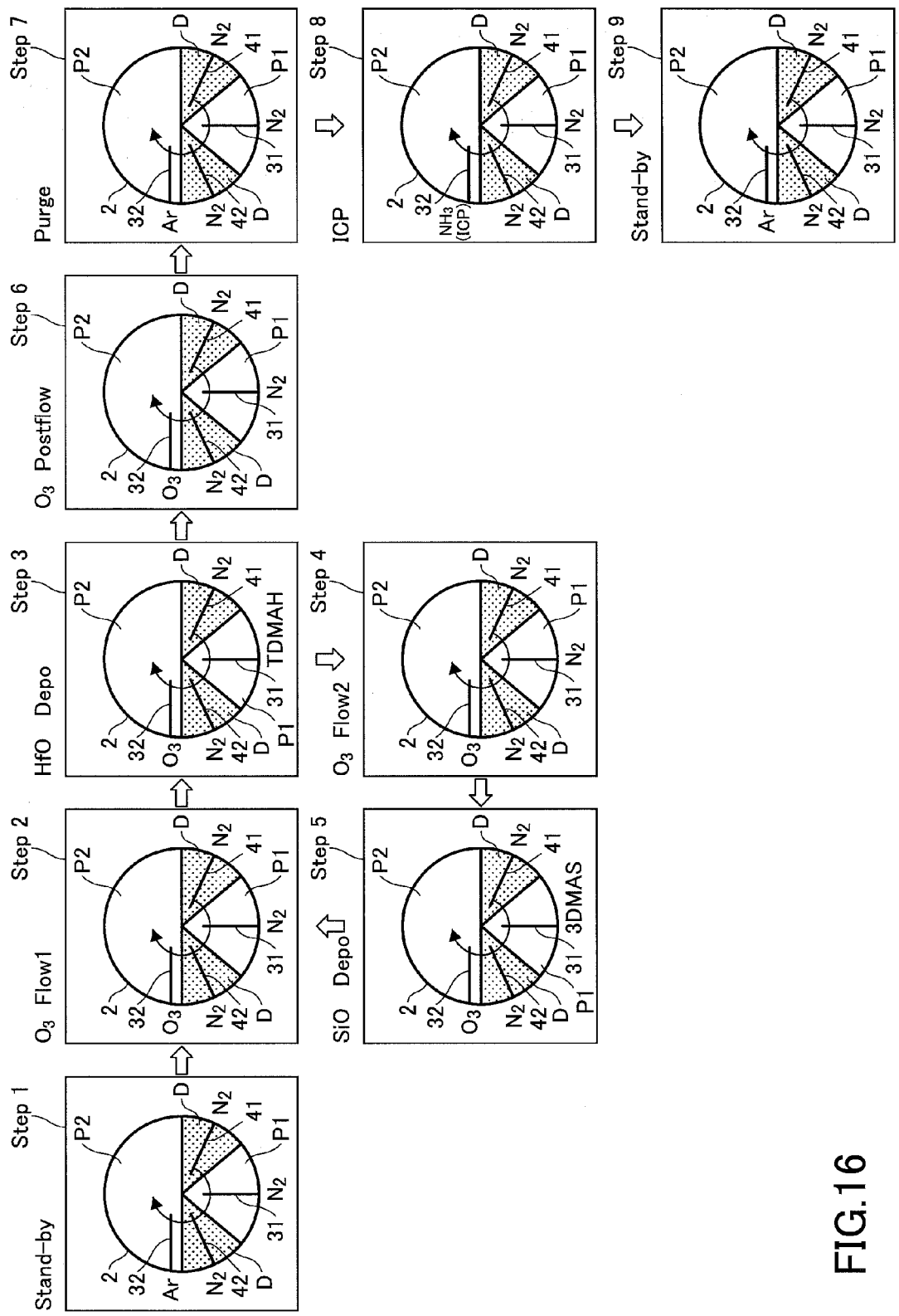
FIG. 16 is a sequential diagram illustrating an example of the method of depositing the film of the fifth embodiment of the present invention.

FIG. 16 is a sequential diagram illustrating an example of the method of depositing the film of the fifth embodiment of the present invention. Referring to FIG. 16, because a stand-by process of step 1, a flow process of flowing the first oxidation gas of step 2, a film deposition process of forming HfO of step 3, a flow process of flowing the second oxidation gas of step 4, and a film deposition process of depositing SiO of step 5 are similar to steps 1 to 5 illustrated in FIG. 14 in the method of depositing the film of the fourth embodiment, description of the processes of steps 1 to 5 is omitted.

In the method of depositing the film of the fifth embodiment, one cycle is formed by the flow process of flowing the first oxidation gas of step 2, the film deposition process of forming HfO of step 3, the flow process of flowing the second oxidation gas of step 4, and the film deposition process of depositing SiO of step 5. Each combination of the HfO layer and the SiO layer is formed during each cycle. Further, the above cycle is repeatedly performed until the HfSiO film having the laminate structure made of the HfO layers and the SiO layers has a required thickness. With this, the HfSiO film of the multilayer structure is obtained as the base as illustrated in FIG. 12.

During the above cycle, the flow process of flowing the first oxidation gas of step 2 comes after the film deposition process of depositing SiO of step 5 and comes before the film deposition process of forming HfO of step 3. Therefore, the flow process of flowing the first oxidation gas of step 2 functions as a post-oxidizing process of the film deposition process of depositing SiO and as a pre-oxidizing process of the film deposition process of forming HfO. In the method of depositing the film of the fifth embodiment, the flow process of flowing the first oxidation gas is assembled in the cycle so as to play a role similar to the flow process of flowing the second oxidation gas. When the laminate structure of the oxide layers containing two types of different elements is formed, the process as described above may be adopted so that the oxidizing process is simplified and the oxidizing processes are securely performed before and after the film deposition process. With this, the laminate structure of the oxide layers containing two types of different elements can be efficiently formed.

After the above film deposition cycle is repeatedly performed a predetermined number of times, the flow process of flowing the first oxidation gas of step 2 and the film deposition process of forming HfO of step 3 are performed once. Thereafter, the flow process of flowing the third oxidation gas of step 6 is performed.

Because the flow process of flowing the third oxidation gas of step S6 is similar to the flow process of flowing the fourth oxidation gas in step 11 of the fourth embodiment illustrated in FIG. 14 and the flow process of flowing the third oxidation gas in step 8 of the first embodiment illustrated in FIG. 8, description of the flow process of flowing the third oxidation gas is omitted.

Further, because a purge process of step 7, a process of doping with nitrogen, and a stand-by process of step 9 are similar to steps 5 to 7 illustrated in FIG. 11, description thereof is omitted.

Within the method of depositing the film of the fifth embodiment, the laminate structure of the HfO layer and the SiO layer is formed, and nitrogen is doped in the final stage as in steps 7 to 9. Then, because all nitrogen in the HfSiON film is added in the single process of doping with nitrogen in step 8, the time duration of the process of doping with nitrogen in step 8 is longer than the process of doping with nitrogen in the repeated cycle. Therefore, the number of turns of the turntable 2 in the process of doping with nitrogen of the fifth embodiment is smaller than the number of turns of the turntable 2 in the process of doping with nitrogen in the method of depositing the film of the first, second, and fourth embodiments. The method of depositing the film of the fifth embodiment is similar to the process of doping with nitrogen of the third embodiment.

Within the method of depositing the film of the fifth embodiment, because the HfSiO film is formed at first and nitrogen is finally doped, the HfSiON film can be formed with a relatively simple sequence.

Sixth Embodiment

Figure 17:
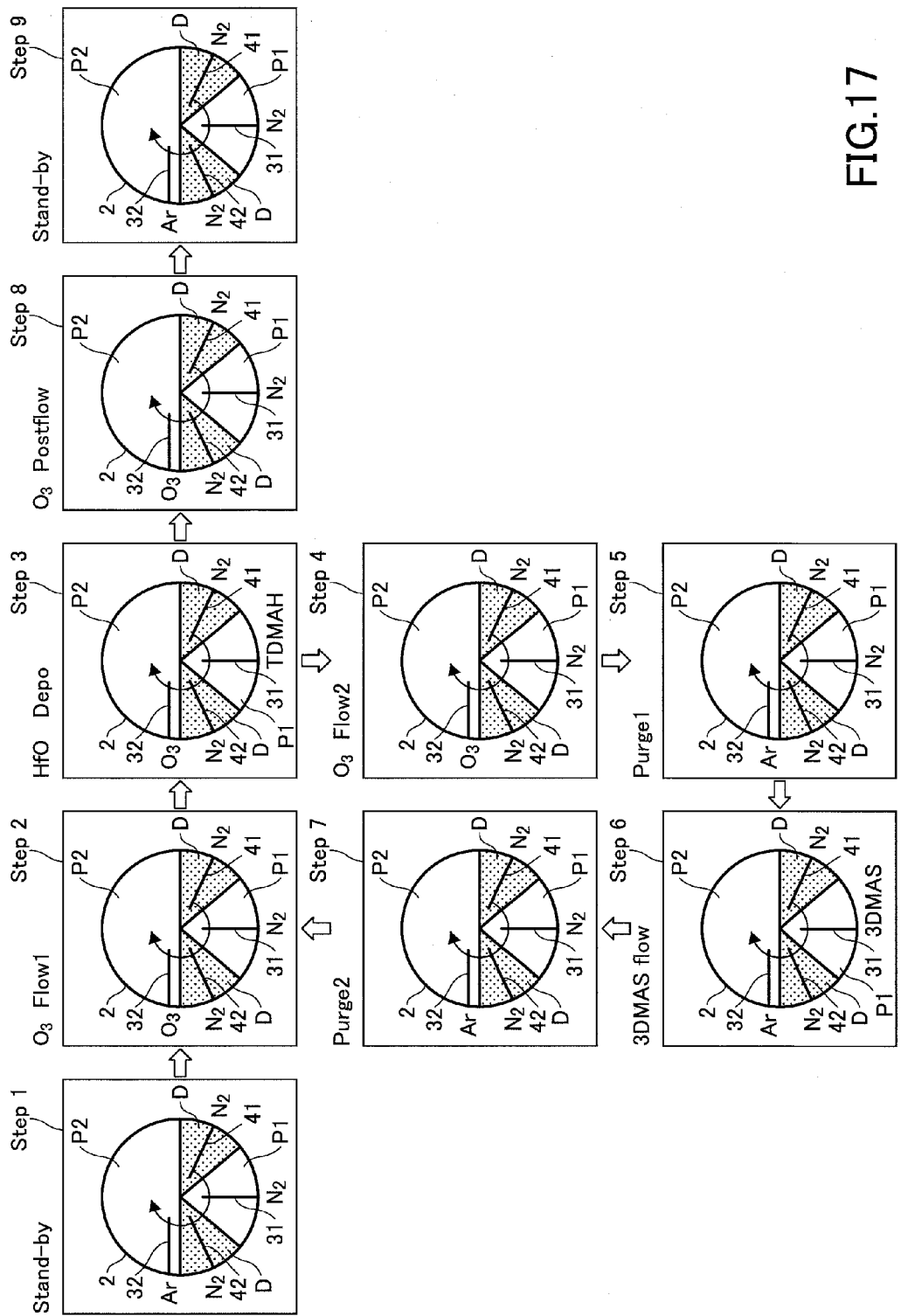
FIG. 17 is a sequential diagram illustrating an example of the method of depositing the film of a sixth embodiment of the present invention.

FIG. 17 is a sequential diagram illustrating an example of a method of depositing a film of sixth embodiment of the present invention. Within the method of depositing the film of the sixth embodiment, a method of forming a HfSiO film by doping Si to a HfO film is described.

The HfSiO film formed by the method of depositing the film of the sixth embodiment corresponds to the HfON film illustrated in FIG. 6 where a part of N is replaced by Si. The added element is not limited to nitrogen and may be silicon or the like. Within the method of depositing the film of the sixth embodiment, an example of replacing the element is described.

Referring to FIG. 17, a stand-by process of step 1, a flow process of flowing the first oxidation gas of step 2, a film deposition process of forming HfO of step 3, a flow process of flowing the second oxidation gas of step 4, a first purge process of step 5, a process of doping silicon of step 6, a second purge process of step 7, a second purge process of step 7, a flow process of flowing the third oxidation gas of step 8, and a stand-by process of step 9 are illustrated. Except for the process of doping silicon of step 6, the processes are similar to the method of depositing the film of the first embodiment illustrated in FIG. 8.

The method of depositing the film of the sixth embodiment differs from the method of depositing the film of the first embodiment at a point that the doped element is changed from nitrogen to silicon. Description of the other processes is omitted.

In the film deposition process of depositing silicon in step 6, a 3DMA gas, which is a raw gas containing Si, is supplied from the reaction gas nozzle 31, Ar is supplied from the reaction gas nozzle 32, and a $N_2$ gas is supplied from the separation gas nozzles 41 and 42. Under the state, the turntable 2 rotates a predetermined number of turns. When nitrogen is doped, a plasma process or the like is generally performed as needed. However, the plasma process is basically unnecessary at a time of doping Si, and the 3DMAS gas as the raw gas is supplied from the reaction gas nozzle 31.

Within the process of doping silicon, unlike the deposition process of depositing SiO, an $O_3$ gas is not supplied from the reaction gas nozzle 32 and an Ar gas being an inert gas is supplied instead. With this, the HfSiO layer is formed by doping Si on the upper surface of the HfO layer. One cycle is formed by processes from the flow process of flowing the first oxidation gas of step 2 to the second purge process of step 7. The cycle is repeatedly performed to form a plurality of HfSiO layers having a predetermined thickness.

In the process of doping silicon of step 6, unlike the process of doping with nitrogen of step 6 in the method of depositing the film of the first embodiment, the 3DMAS gas is not supplied from the reaction gas nozzle 32 of the second process area P2 but supplied from the reaction gas nozzle 31 of the first process area P1. This is because an ordinary method of supplying a reaction gas in a film deposition apparatus is adapted. Ordinarily, an oxygen gas and an nitrogen gas are supplied from the reaction gas nozzle 32, and a raw gas as a raw material of a film to be deposited is supplied from the reaction gas nozzle 31. Therefore, the reaction gas nozzles 31 and 32 on the supply side can be appropriately allocated to a gas to be supplied depending on the property of the gas to be supplied. Further, the allocation of the reaction gas nozzles 31 and 32 on the supply side to the gas can be appropriately changed depending on usage or conditions.

As described, within the method of depositing the film of the sixth embodiment, the HfSiO film may be formed by doping Si to the HfO film.

Seventh Embodiment

Figure 18:
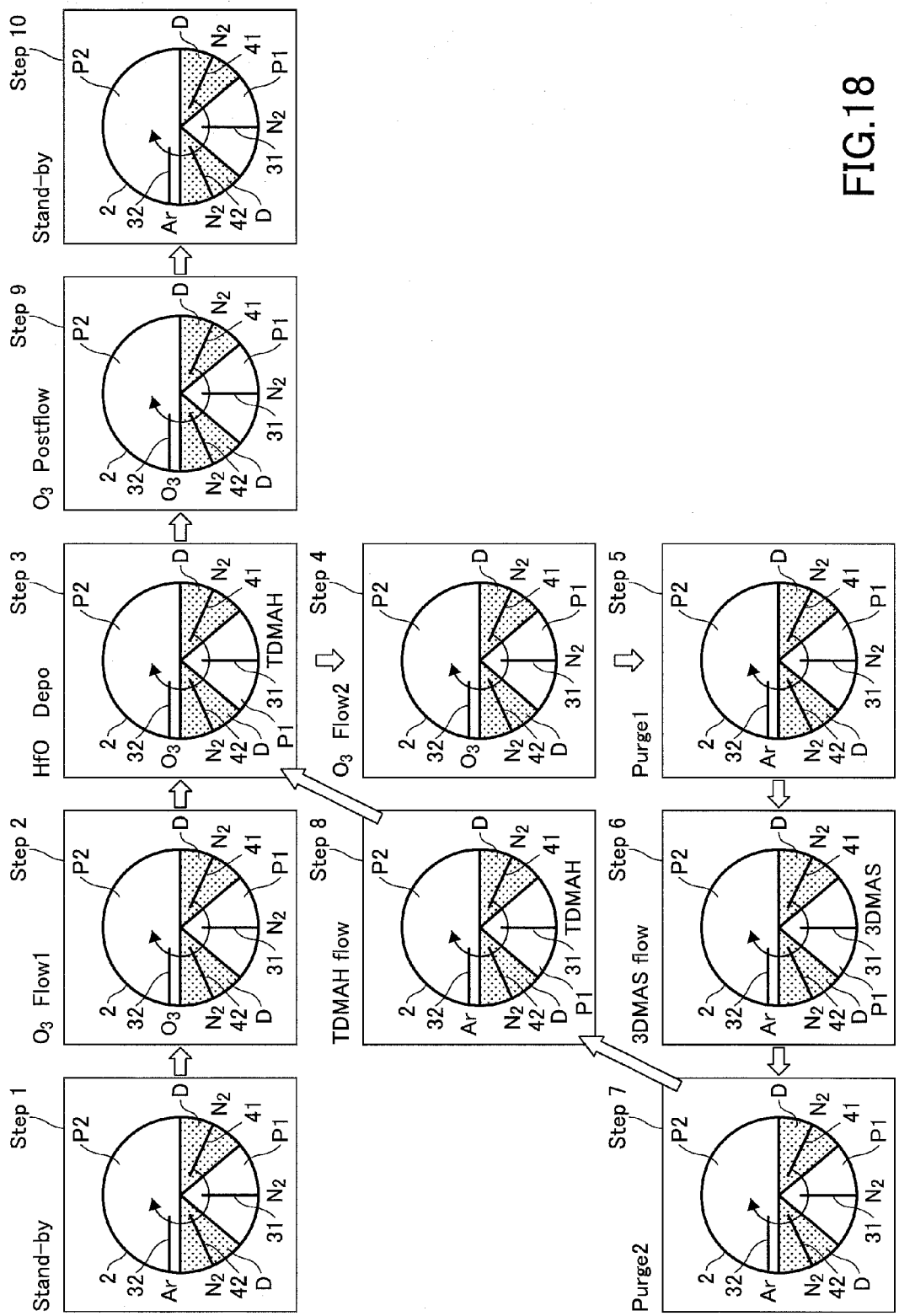
FIG. 18 is a sequential diagram illustrating an example of a method of depositing a film of a seventh embodiment of the present invention.

FIG. 18 is a sequential diagram illustrating an example of a method of depositing a film of a seventh embodiment of the present invention. Within the method of depositing the film of the seventh embodiment, in a manner similar to the method of depositing the film of the sixth embodiment, the method of forming the HfSiO film by doping Si to the HfO film is described. The sequence of the method of depositing the film of the seventh embodiment is similar to the sequence of the method of depositing the film of the second embodiment illustrated in FIG. 9 where the doped element is replaced from nitrogen to silicon.

Specifically, the method of depositing the film includes a stand-by process of step 1, a flow process of flowing the first oxidation gas of step 2, a film deposition process of forming HfO of step 3, a flow process of flowing the second oxidation gas of step 4, a first purge process of step 5, a process of doping silicon of step 6, a second purge process of step 7, a process of supplying the Hf raw gas of step 8, a flow process of flowing the third oxidation gas of step 9, and a stand-by process of step 10. Because the processes other than the process of doping silicon of step 6 are similar to the processes of the method of depositing the film of the second embodiment, description is omitted.

Because the content of the process of doping silicon of step 6 is similar to that of step 6 of the method of depositing the film of the embodiment 6 illustrated in FIG. 17, description is omitted.

Within the method of depositing the film of the seventh embodiment, even though the element to be doped is changed to silicon, it is possible to prevent the doped silicon from being extinguished and dispersed and to securely dope silicon by providing the process of supplying the Hf raw gas of step 8 after doping silicon.

Within the above first to seventh embodiments, the examples of depositing the HfO film are described. The elements may be selected from various metal elements or various semiconductor elements depending on usage. For example, an oxide film containing Zr, Hf, Al, Ti, Sr, Si, or the like may be used.

According to the embodiments of the present invention, it is possible to dope a predetermined element to an oxide film with high productivity.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of depositing the film have been described in detail, it should be understood that the various changes, substitutions, and alterations could be made hereto without departing from the spirit and scope of the invention.

What is claimed is:

1. A method of depositing a film of forming a doped oxide film, which includes a first oxide film containing a first element and doped with a second element, on a plurality of substrates using a film deposition apparatus including a turntable that is accommodated in a chamber, is rotatable, and includes mounting portions formed on an upper surface of the turntable so that the substrates are mounted on the mounting portions, a first process area laid out above the upper surface of the turntable and being provided with a first reaction gas supplying portion, which supplies gases toward the upper surface of the turntable, a second process area arranged apart from the first process area along a peripheral direction of the turntable and being provided with a second reaction gas supplying portion, which supplies the gases toward the upper surface of the turntable, and a separation area including a separation gas supplying portion provided between the first process area and the second process area and supplying a separation gas onto the upper surface of the turntable, and a ceiling surface forming a narrow space so that the narrow space for introducing the separation gas supplied from the separation gas supplying portion to the first process area and the second process area is formed between the ceiling surface and the surface of the turntable, the method of depositing the film comprising:

a first film deposition process of depositing the first oxide film containing the first element onto the substrates by rotating the turntable a predetermined number of turns while a first reaction gas containing the first element is supplied from the first reaction gas supplying portion, an oxidation gas is supplied from the second reaction gas supplying portion, and the separation gas is supplied from the separation gas supplying portion; and a doping process of doping the first oxide film with the second element by rotating the turntable a predetermined number of turns while a second reaction gas containing the second element is supplied from one of the first reaction gas supplying portion and the second reaction gas supplying portion, an inert gas is supplied from another one of the first reaction gas supplying portion and the second reaction gas supplying portion, and the separation gas is supplied from the separation gas supplying portion.

2. The method of depositing the film according to claim 1, further comprising:

first and second purge processes of rotating the turntable while the separation gas is supplied from the first reaction gas supplying portion, the inert gas is supplied from the second reaction gas supplying portion, and the separation gas is supplied from the separation gas supplying portion, the first and second purge processes being performed before and after the doping process.

3. The method of depositing the film according to claim 2, further comprising:

a first post-oxidizing process of rotating the turntable at least one turn while the separation gas is supplied from the first reaction gas supplying portion, the oxidation gas is supplied from the second reaction gas supplying portion, and the separation gas is supplied from the separation gas supplying portion, the first post-oxidizing process being performed between the first film deposition process and the doping process.

4. The method of depositing the film according to claim 3, further comprising:

a pre-oxidizing process of rotating the turntable at least one turn while the separation gas is supplied from the first reaction gas supplying portion, the oxidation gas is supplied from the second reaction gas supplying portion, and the separation gas is supplied from the separation gas supplying portion, the pre-oxidizing process being performed before the first film deposition process.

5. The method of depositing the film according to claim 4, wherein each cycle including the pre-oxidizing process, the first film deposition process, the first post-oxidizing process, the first purge process, the doping process, and the second purge process is repeatedly performed a predetermined number of times to form the doped oxide film of a laminated film including the first oxide films, which contain the first element and are doped with the second element.

6. The method of depositing the film according to claim 5, wherein the pre-oxidizing process is performed once, the first film deposition process is performed once, and the first post-oxidizing process is performed once after each cycle is repeatedly performed the predetermined number of times and then formation of the doped oxide film is finished.

7. The method of depositing the film according to claim 6, wherein a time duration of performing the first post-oxidizing process after repeatedly performing each cycle is longer than a time duration of performing the first post-oxidizing process during repeatedly performing each cycle.

8. The method of depositing the film according to claim 4, further comprising:

a process of supplying a first reaction gas of rotating the turntable a predetermined number of turns while the first reaction gas is supplied from the first reaction gas supplying portion, the inert gas is supplied from the second reaction gas supplying portion, and the separation gas is supplied from the separation gas supplying portion, wherein a cycle including the first film deposition process after the process of supplying the first reaction gas is performed.

9. The method of depositing the film according to claim 8, wherein each cycle including the first film deposition process, the first post-oxidizing process, the first purge process, the doping process, the second purge process, and the process of supplying the first reaction gas is repeatedly performed a predetermined number of times to form the doped oxide film of a laminated film including the first oxide films, which contain the first element and are doped with the second element.

10. The method of depositing the film according to claim 9, wherein the first film deposition process is performed once, and the first post-oxidizing process is performed once after each cycle is repeatedly performed the predetermined number of times and then formation of the doped oxide film is finished.

11. The method of depositing the film according to claim 8, further comprising:

a second film deposition process of depositing a second oxide film containing a third element onto the first oxide film by rotating the turntable a predetermined number of turns while a third reaction gas containing a third element is supplied from the first reaction gas supplying portion, the oxidation gas is supplied from the second reaction gas supplying portion, and the separation gas is supplied from the separation gas supplying portion, the second film deposition process being provided between the first post-oxidizing process and the first purge process; and a second post-oxidizing process of rotating the turntable at least one turn while the separation gas is supplied from the first reaction gas supplying portion, the oxidation gas is supplied from the second reaction gas supplying portion, and the separation gas is supplied from the separation gas supplying portion, the second post-oxidizing process being provided between the first post-oxidizing process and the first purge process.

12. The method of depositing the film according to claim 11, wherein each cycle including the film deposition process, the first post-oxidizing process, the second film deposition process, the second post-oxidizing process, the first purge process, the doping process, the second purge process, and the process of supplying the first reaction gas is repeatedly performed a predetermined number of times to form the doped oxide film by laminating an oxide film and a layer doped with the second element, the oxide film being made of the first oxide film, which contains the first element, and the second oxide film, which contains the third element and formed on the first oxide film.

13. The method of depositing the film according to claim 4, further comprising:

a second film deposition process of rotating the turntable a predetermined number of turns while a third reaction gas containing a third element is supplied from the first reaction gas supplying portion, the oxidation gas is supplied from the second reaction gas supplying portion, and the separation gas is supplied from the separation gas supplying portion to deposit a second oxide film containing the third element on the first oxide film, the second film deposition process being performed after the first post-oxidizing process; and each cycle including the second film deposition process and the pre-oxidizing process wherein the pre-oxidizing process is performed after the second film deposition process.

14. The method of depositing the film according to claim 13, wherein the pre-oxidizing process is performed once, the first film deposition process is performed once, and the first post-oxidizing process is performed once after each cycle is repeatedly performed a predetermined number of times and then formation of the doped oxide film is finished.

15. The method of depositing the film according to claim 13, wherein the third element is a metal element or silicon.

16. The method of depositing the film according to claim 15, wherein the metal element is hafnium, zirconium, or aluminum.

17. The method of depositing the film according to claim 1, wherein the first element is a metal element.

18. The method of depositing the film according to claim 1, wherein the second element is nitrogen.

19. The method of depositing the film according to claim 18, wherein the second reaction gas is $NH_3$, and undergoes a plasma process so as to be supplied onto an upper portion of the first oxide film.

20. The method of depositing the film according to claim 1, wherein the second element is silicon.

* * * * *